(12) United States Patent
Weller

(10) Patent No.: US 8,717,200 B2
(45) Date of Patent: May 6, 2014

(54) TEXT ENTRY DEVICE WITH RADIAL KEYPAD LAYOUT

(76) Inventor: Jeffrey C Weller, Anderson, SC (US)

( * ) Notice: Subject to any disclaimer, the term of this patent is extended or adjusted under 35 U.S.C. 154(b) by 0 days.

(21) Appl. No.: 13/530,060

(22) Filed: Jun. 21, 2012

(65) Prior Publication Data

US 2012/0262311 A1    Oct. 18, 2012

Related U.S. Application Data

(63) Continuation-in-part of application No. 12/587,723, filed on Oct. 13, 2009, now Pat. No. 8,319,669.

(60) Provisional application No. 61/214,303, filed on Apr. 22, 2009.

(51) Int. Cl.
    *H03M 11/00*    (2006.01)

(52) U.S. Cl.
    USPC ................................... 341/22; 341/20

(58) Field of Classification Search
    USPC .................. 341/20, 22; 345/168; 400/486
    See application file for complete search history.

(56) References Cited

U.S. PATENT DOCUMENTS

| | | | |
|---|---|---|---|
| 4,876,415 A | 10/1989 | Clancy | |
| 5,017,030 A * | 5/1991 | Crews | ........................ 400/485 |
| 5,332,322 A | 7/1994 | Gambaro | |
| 5,397,189 A | 3/1995 | Minogue | |
| 5,481,263 A | 1/1996 | Choi | |
| 5,483,235 A | 1/1996 | Hanson et al. | |
| 5,689,253 A | 11/1997 | Hargreaves et al. | |
| 5,774,384 A | 6/1998 | Okaya et al. | |
| 6,288,709 B1 * | 9/2001 | Willner et al. | ................ 345/169 |
| D449,611 S | 10/2001 | Kendall | |
| 6,542,091 B1 * | 4/2003 | Rasanen | ........................ 341/22 |
| 6,543,947 B2 | 4/2003 | Lee | |
| 6,567,072 B2 | 5/2003 | Watanabe | |
| 6,657,560 B1 | 12/2003 | Jung | |

(Continued)

FOREIGN PATENT DOCUMENTS

| | | | |
|---|---|---|---|
| JP | 2000-010716 A | 1/2000 | |
| JP | 2005-526303 A | 9/2005 | |
| KR | 10-2006-0119527 A | 11/2006 | |
| KR | 10-0855448 B1 | 9/2008 | |

OTHER PUBLICATIONS

International Searching Authority; International Search Report and Written Opinion of the International Searching Authority; Publisher is Korean Intellectual Property Office; Seo-gu, Daejeon Republic of Korea; International Application No. PCT/US2010/002753; mailing date Aug. 2, 2011; (8 pages).

(Continued)

*Primary Examiner* — Brian Young
(74) *Attorney, Agent, or Firm* — Neal P Pierotti; Metz Lewis Brodman Must O'Keefe

(57) ABSTRACT

A text entry device is provided. The device includes a concentric and a first grouping of letters including the letters A, B, C and D and that has at least one key that is touched by a user when actuated. A second grouping of letters including the letters E, F, G and H is included and has at least one key that is touched by the user when actuated. At least a portion of the key of the first grouping is located at a different angular position with respect to the concentric than at least a portion of the key of the second grouping.

22 Claims, 34 Drawing Sheets

(56) References Cited

U.S. PATENT DOCUMENTS

| | | |
|---|---|---|
| 6,698,952 B1 | 3/2004 | Goddard |
| 6,860,661 B1 | 3/2005 | Daoud |
| 7,113,111 B2 | 9/2006 | Tyneski et al. |
| D538,281 S | 3/2007 | Gambaro |
| 7,186,041 B2 | 3/2007 | Harley |
| 8,459,885 B2 * | 6/2013 | Min .............................. 400/472 |
| 2006/0133881 A1 | 6/2006 | Osburn et al. |
| 2006/0294273 A1 | 12/2006 | Lee |
| 2009/0189864 A1 | 7/2009 | Walker |
| 2010/0271241 A1 | 10/2010 | Weller |

OTHER PUBLICATIONS

United States Patent and Trademark Office; Office Action; Office Action from U.S. Appl. No. 12/587,723; copyright and mailing date Apr. 19, 2012, pp. 1-6, publisher United States Patent and Trademark Office, Alexandria, Virginia, USA; (6 pages).

International Bureau of WIPO; International Preliminary Report on Patentability; Publisher is the International Bureau of WIPO, Geneva, Switzerland; International Application No. PCT/US2010/002753; copyright and mailing date Apr. 25, 2013, pp. 1-6, (6 pages).

* cited by examiner

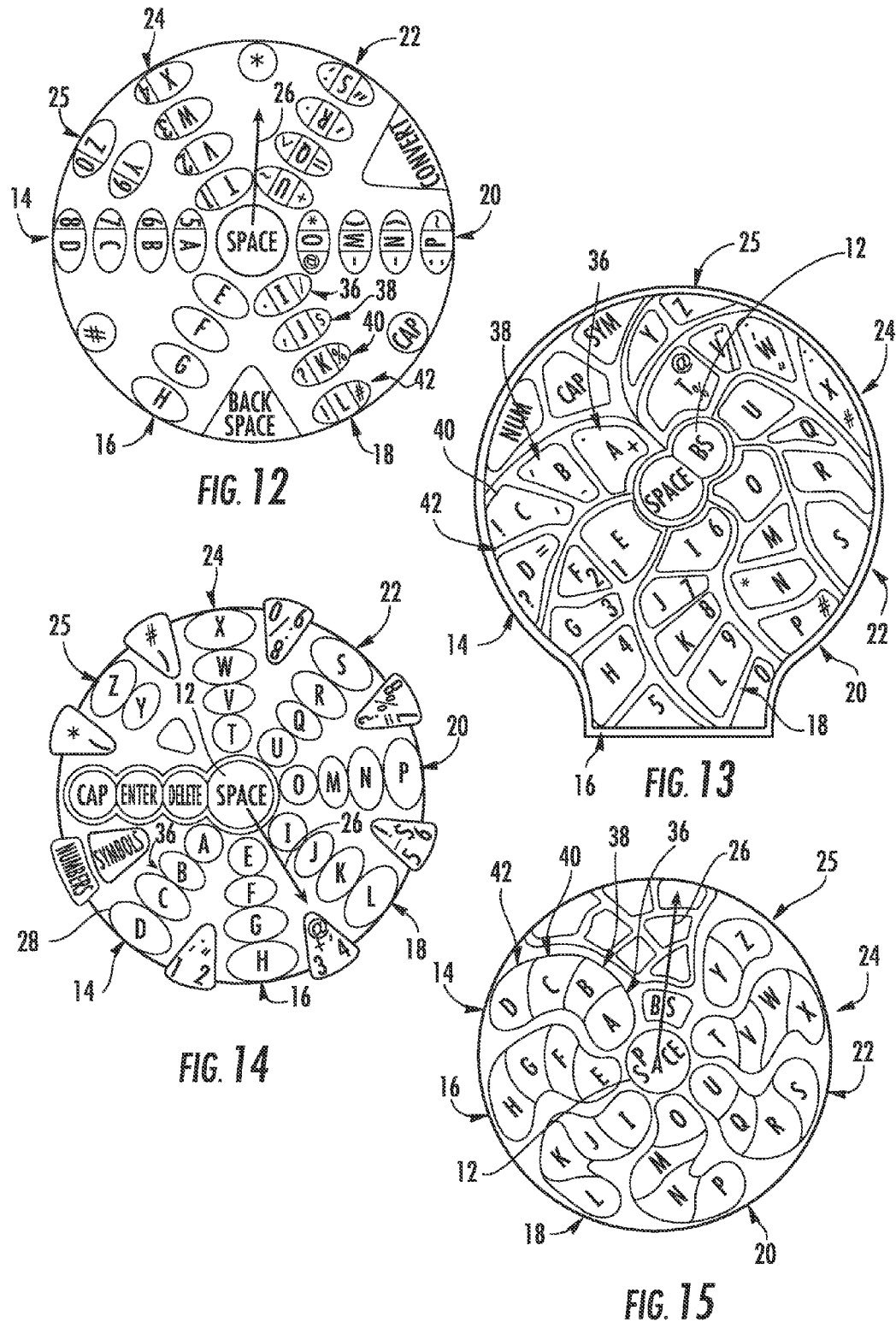

TEXT ENTRY DEVICE WITH RADIAL KEYPAD LAYOUT

CROSS REFERENCE TO RELATED APPLICATIONS

This application is a continuation-in-part and claims the benefit of U.S. application Ser. No. 12/587,723 filed on Oct. 13, 2009 and entitled, "Text entry device with radial keypad layout." U.S. application Ser. No. 12/587,723 claims the benefit of U.S. Application Ser. No. 61/214,303 filed on Apr. 22, 2009 and entitled, "Multi-Feature Compact User Interface/Keypad." Both U.S. Application Ser. No. 61/214,303 and U.S. application Ser. No. 12/587,723 are incorporated by reference herein in their entireties for all purposes.

FIELD OF THE INVENTION

The present invention relates generally to a text entry device for use in entering text by a user. More particularly, the present application involves a text entry device for thumb actuation in which letters are arranged thereon for optimum clarity and memory impact to achieve greater ease of use.

BACKGROUND

Text entry devices are known for use on electronic devices such as cell phones, gaming consoles, cameras, personal digital assistants, keypads, and remote controls. The sending and receiving of text messages is becoming a popular mode of communication and in certain age groups is in fact more preferred than voice communication. Text entry devices for these types of electronic devices employ one of two general formats.

An alpha-numeric layout is often used that generally includes ten numbered keys typically with three letters assigned to each key. Other keys may have more than three letters assigned thereto. The user will typically have to tap the key multiple times so that the desired character is registered in the device. Such alpha-numeric layouts typically require the user watch an input screen to ensure the data is entered correctly.

Another layout used with electronic devices is a QWERTY keypad which is a standard keyboard layout. Such a layout is familiar with the user due to its common usage in other applications and can thus be picked up on by the user with little difficulty. Each letter of the QWERTY layout is assigned its own key which increases the speed at which data can be entered. However, the keypad must be made in a reduced layout on certain electronic devices thus causing thumb and finger extension to be awkward and exceed natural movements. Entering of text on such reduced sized keypads is commonly done with the use of both thumbs. Further, the close proximity of the keys to one another causes inadvertent keys to be struck. As such, there remains room for variation and improvement in the art.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended Figures in which;

FIG. 12 is a top view of a text entry device that includes multi-tap keys that have letters along with numbers and symbols.

FIG. 13 is a top view of a text entry device that has keys shaped and sized so as to receive a thumb print of the user upon actuating the keys from an at-rest position at the concentric.

FIG. 14 is a top view of a text entry device in which a single row of keys having letters is present.

FIG. 15 is a top view of a text entry device in which keys that are irregular in shape that extend in groupings that are irregular in shape are present.

Figure 1:
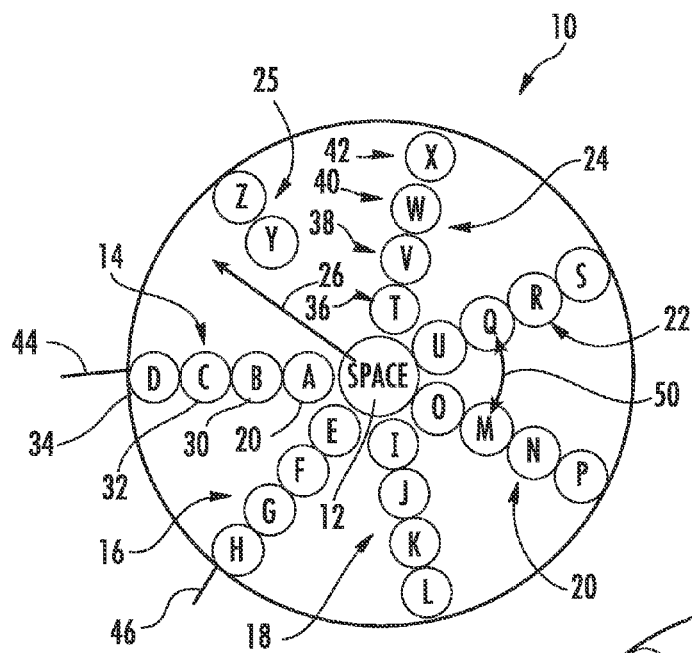
FIG. 1 is a top view of a text entry device in accordance with one exemplary embodiment.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

It is to be understood that the ranges mentioned herein include all ranges located within the prescribed range. As such, all ranges mentioned herein include all sub-ranges included in the mentioned ranges. For instance, a range from 100-200 also includes ranges from 110-150, 170-190, and 153-162. Further, all limits mentioned herein include all other limits included in the mentioned limits. For instance, a limit of up to 7 also includes a limit of up to 5, up to 3, and up to 4.5.

The present invention provides for a text entry device 10 that is arranged for improved text entry as compared to other devices. Although capable of being actuated by any number of fingers or thumbs of the user, the user may actuate all of the keys of the text entry device 10 through the use of a single thumb. The letters that are to be struck are arranged in such a fashion that the speed of inputting is increased versus standard QWERTY keyboard layouts. Additional embodiments are possible in which color is used to highlight and thus facilitate easier striking of certain keys of the text entry device 10. An additional aspect exists in the provision of a text entry device 10 that employs keys that have upper surfaces configured in a generally concave, bowl-like shape. Such an arrangement provides an ergonomic keypad layout and allows for improved text entry by the user.

One exemplary embodiment of the text entry device 10 is shown in FIG. 1. Here, the letters are arranged on keys such that a single key is devoted to a single letter. All of the letters of the alphabet are included. The layout of the text entry device 10 includes a concentric 12 which in this embodiment includes a key that is a space key. The concentric 12 may be the point from which the keys including the letters of the alphabet extend. The concentric 12 is shown in FIG. 1 as being the centrally located point of the keypad layout of the text entry device 10. However, it is to be understood that the concentric 12 need not be the centrally located point in other embodiments. As used herein, the concentric 12 is the location from which at least some of the disclosed groupings of letters extend, for example the first grouping 14, second grouping 16, third grouping 18, and fourth grouping 20. The concentric need not be a circular location or point but can be variously shaped in accordance with other exemplary embodiments.

The concentric 12 may include the space key since the space key is a commonly used key and the thumb of the user may be initially positioned at the concentric 12 upon grasping the text entry device 10. A first grouping 14 of letters extends in the radial direction 26 from the concentric 12 and is linearly arranged so that all of the keys of the first grouping 14 are at different radial distances from the concentric 12. The letters of the first grouping 14 from closest to farthest from the concentric 12 in the radial direction 26 are A, B, C and D in that order. As such, the letter A is closer to the concentric than the letter D. The letters of the first grouping 14 are located on individual keys 28, 30, 32 and 34 that are actuated by the user in order to cause the appropriate letter to be input into the text entry device 10. As shown, the letter A is on key 28, the letter B is on key 30, the letter C is on key 32, and the letter D is on key 34. Although described as being actuated by the thumb of the user, it is to be understood that the keys of the text entry device 10 may be actuated by both thumbs of the user, by fingers of the user, or any combination of thumbs and fingers in accordance with other exemplary embodiments.

The text entry device 10 also includes a second grouping 16 of letters that extends in a linear direction from the concentric 12. All of the letters of the second grouping 16 are at different radial distances from the concentric 12. The letters of the second grouping 16 from closest to farthest from the concentric 12 in the radial direction 26 are E, F, G and H in that order.

A third grouping 18 of letters is present and extends linearly from the concentric 12 so that each letter is located at a different radial distance from the concentric 12. The letters of the third grouping 18 from closest to farthest from the concentric 12 in the radial direction 26 are I, J, K and L in that order.

A fourth grouping 20 of letters is also included in the text entry device 10 and are likewise linearly arranged from the concentric 12 so that each letter is located a different radial distance from concentric 12. The letters of the fourth grouping 20 from closest to farthest from the concentric 12 in the radial direction 26 are O, M, N and P in that order.

A fifth grouping 22 is present and includes letters that extend linearly from the concentric 12 so that each letter is located a different radial distance therefrom. The fifth grouping 22 includes letters U, Q, R and S in that order that extend from closest to farthest from the concentric 12.

A sixth grouping 24 exists that includes letters that are linearly arranged extending from the concentric 12 so that each letter is located a different radial distance from the concentric 12. The letters of the sixth grouping 24 from closest to farthest from the concentric 12 in the radial direction 26 are T, V, W and X in that order.

A seventh grouping 25 is included and includes two letters that are likewise linearly arranged extending from the concentric 12. The seventh grouping 25 includes the letter Y which is closer to the concentric 12 than the letter Z which is farther from the concentric 12 in the radial direction 26. The letter Y is spaced the same distance from the concentric 12 as the letters C, G, K, N, R and W of the other groupings 14, 16, 18, 20, 22 and 24.

The groupings 14, 16, 18, 20, 22 and 24 include letters with single keys that are all linearly arranged from the concentric 12. The letters of the groupings 14, 16, 18, 20, 22 and 24 can all be spaced equally such that the first letters of the groupings 14, 16, 18, 20, 22 and 24 are all spaced an equal distance from the concentric 12, and so that the second letters are all spaced an equal distance from the concentric 12, and so forth. The groupings 14, 16, 18, 20, 22, 24 and 25 are distinguished from one another in that each one is located at a different angular position about the concentric 12. As such, all of the letters of the first grouping 14 have the same angular position 44 as one another but a different angular position than the letters in the other groupings 16, 18, 20, 22, 24 and 25. As shown for sake of example, the first grouping 14 has angular position 44 while the second grouping 16 has angular position 46 which is a different angular position. The groupings 14, 16, 18, 20, 22, 24 and 25 are also distinguished from one another as the letters of each individual grouping are immediately adjacent one another. Further, the groupings 14, 16, 18, 20, 22, 24 and 25 may be thought of as being arrays that extend from the concentric 12 such that the letters of the individual groupings 14, 16, 18, 20, 22, 24 and 25 extend along the array.

As used herein, the term "vowels" refers to the letters A, E, I, O and U. The term "consonants" refers to the remaining letters of the alphabet that are not vowels as previously defined. Groupings 20 and 22 may be separated an arc length 50 from one another. It is to be understood that the terms arc length and the distance in the angular direction are interchangeable with one another so far as they describe the position of a grouping or other object about the concentric 12.

The letters of the text entry device 10 are arranged so that a number of rows of letters are formed around the concentric 12. The rows may extend 360° around the concentric 12 so as to completely surround the concentric 12, or the rows may extend along an arc length that is less than 360° so that the concentric 12 is only partially surrounded with letters. As shown, a first row 36 is defined that includes the letters A, E, I, O, U and T that are all equally distant from the concentric 12 in the radial direction 26. A second row 38 is likewise defined that includes letters B, F, J, M, Q, and V that are all an equal distance from the concentric 12 in the radial direction 26. A third row 40 is present that includes letters C, G, K, N, R, W and Y that are all equally distant from the concentric 12 in the radial direction 26. Additionally, a fourth row 42 is present that includes the letters D, H, L, P, S, X and Z that are all an equal distance from the concentric 12 in the radial direction 26.

The rows 36, 38, 40 and 42 may be arranged so that letters of each row in consecutive angular position are not consecutive consonants of the alphabet. For example, the second row 30 includes letters B, F, J, M, Q and V in consecutive angular positions in that order. None of the consonants of the second row 30 are consecutive with another consonant in the immediately adjacent angular position. In this regard, letters of the alphabet are present between the letters B and F, letters of the alphabet are present between the letters F and J, and so forth. However, it is to be understood that other arrangements are possible in which one or more of the rows 36, 38, 40 and/or 42 have consecutive alphabetic consonants in immediately adjacent angular positions. In other arrangements, one of the rows 36, 38, 40 and 42 may have an instance of consecutive alphabetic consonants in immediately adjacent angular positions while the other rows 36, 38, 40 and 42 do not. In yet other arrangements, at least two of the rows 36, 38, 40 and 42 of the text entry device 10 do not have any consecutive alphabetic consonants in immediately adjacent angular positions. The vowels may be placed in consecutive order of appearance in the alphabet in row 36 extending angularly around the concentric 12. Although shown alphabetically as progressing in a counterclockwise direction, the letters of the text entry device 10 can be arranged in other embodiments so that they progress in a clockwise direction about the concentric 12. The groupings 14, 16, 18, 20, 22, 24 and 25 may be positioned at angular positions about the concentric 12 so that they are equally spaced from immediately adjacent groupings 14, 16, 18, 20, 22, 24 and 25 such that their arc length from one to the next is the same. Alternatively, the groupings 14, 16, 18, 20, 22, 24 and 25 can be located so that they are at different arc lengths from immediately adjacent groupings 14, 16, 18, 20, 22, 24 and 25 about the concentric 12.

The letters can be arranged symmetrically or asymmetrically about the concentric 12. The arrangement of FIG. 1 can be modified in accordance with other exemplary embodiments. For example, in one arrangement the sixth grouping 24 can be provided so that the letters Y, T, V and W in that order extend in the radial direction 26 from the concentric 12 so that each letter of the sixth grouping 24 is located at a different radial distance from concentric 12. The seventh grouping 25 can be modified so that the letter Y is replaced with the letter X. In another exemplary embodiment of the text entry device 10, the arrangement of FIG. 1 can be modified so that the sixth grouping 24 includes three letters T, V and W in that order that extend in the radial direction 26 from the concentric 12. The seventh grouping 25 includes the letters X, Y and Z in that order that extend in the radial direction 26 from the concentric 12. The sixth and seventh groupings 24 and 25 may start radially immediately adjacent the concentric 12 or may be spaced from the concentric 12 so that the farthest letter of each grouping 24 and 25 is on the outer perimeter of the keypad layout.

The groupings of letters and their arrangement may allow for faster entry to be made by the user of the text entry device 10 and may result in less errors being made thus increasing the efficiency of the entry.

Figure 2:
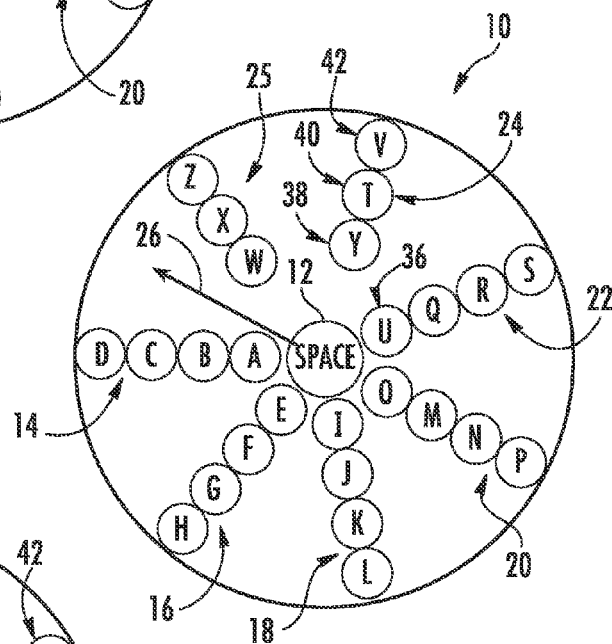
FIG. 2 is a top view of a text entry device similar to FIG. 1 in which the fifth and sixth grouping of letters are arranged differently.

Another exemplary embodiment of the text entry device 10 is illustrated in FIG. 2. The keypad layout of FIG. 2 is substantially similar to that of FIG. 1. However, the sixth grouping 24 includes the letters Y, T and V in that order that extend in the radial direction 26 from the concentric 12 so that each letter of the sixth grouping 24 is located at a different radial distance from the concentric 12. The seventh grouping 25 is also different in that it includes three letters that are W, X and Z that extend in that order in the radial direction 26 from the concentric 12 and again are linearly arranged so that they are each located at a different radial distance from concentric 12.

Figure 3:
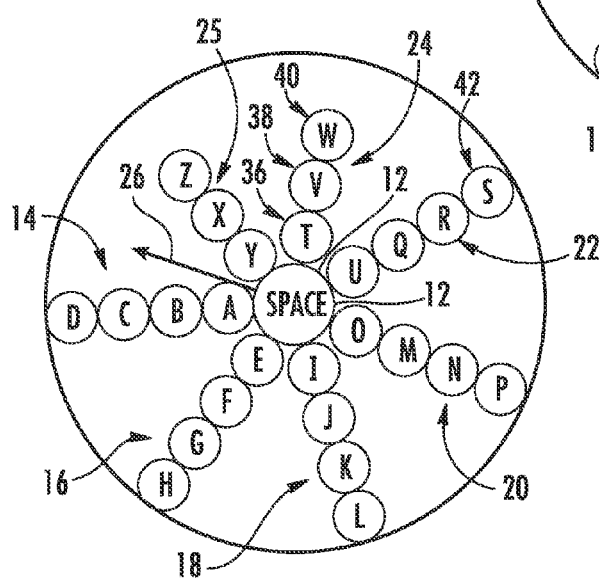
FIG. 3 is a top view of a text entry device similar to FIG. 1 in which the fifth and sixth groupings of letters are arranged differently.

Another arrangement of the text entry device 10 is shown in FIG. 3 that is similar to that of FIG. 1. However, the sixth grouping 24 is different in that it is only three letters long with the letters T, V and W in that order that extend in the radial direction 26 from the concentric 12. The seventh grouping 25 is likewise different and includes three letters Y, X and Z in that order that extend in the radial direction 26 from the concentric 12. Both the sixth and seventh groupings 24 and 25 begin immediately adjacent the concentric 12 so that the letters T and Y are in the first row 36, the letters V and X are in the second row 38, and the letters W and Z are in the third row 38. Again, the letters in each of the rows 36, 38, 40 and 42 are located the same distance from one another in the radial direction 26 from the concentric 12.

Although shown as being circular in shape, the keys 28 of the text entry device 10 can be variously shaped in accordance with other embodiments. Further, the letters can be arranged so that the letters of the groupings 14, 16, 18, 20, 22, 24 and 25 all extend in a linear manner from the concentric 12 and are located symmetrically or asymmetrically about the concentric 12. In this regard, the groupings 14, 16, 18, 20, 22, 24 and 25 can be arranged so that there is a gap between adjacent groupings 14, 16, 18, 20, 22, 24 and 25 in angular direction that is larger than the angular distance between other adjacent groupings 14, 16, 18, 20, 22, 24 and 25. This gap may be used by the user as a tactile reference aid or may include other keys of the text entry device 10 such as number 72, symbol 74, function 76, or back space 78 keys. Other gaps may also be present between other adjacent groupings 14, 16, 18, 20, 22, 24 and 25 so that these gaps are larger than those between the remaining adjacent groupings 14, 16, 18, 20, 22, 24 and 25 that may be exploited in a similar manner. In accordance with another exemplary embodiment, the seventh grouping 25 may include the Y and Z letters and may not be linearly arranged with respect to the concentric 12. Here, the seventh grouping 25 may merely be located adjacent the outer two letters of the sixth grouping 24 and thus offset from the concentric 12 and not linearly arranged therewith in the radial direction 26.

Figure 4:
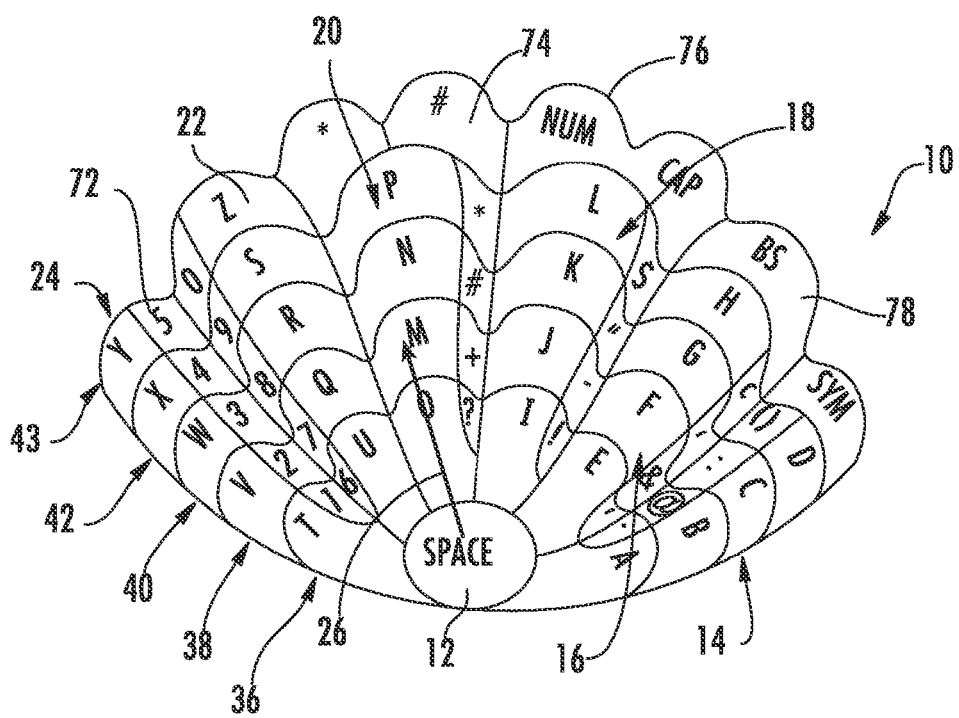
FIG. 4 is a top view of a text entry device in accordance with another exemplary embodiment in which all of the letters extend less than 180° about the concentric.

FIG. 4 shows an alternative exemplary embodiment of the text entry device 10. The concentric 12 includes the space button but is not located at the center of the keypad but rather on the bottom edge. However, letters of the text entry device 10 all extend from the concentric 12. The first grouping 14 includes the letters A, B, C and D in that order that extend from the concentric 12 in the radial direction 26. The second, third and fourth groupings 16, 18 and 20 are arranged in an order previously discussed. The fifth grouping 22 includes the letters U, Q, R, S and Z in that order from the concentric 12 in the radial direction 26. Further, the seventh grouping 24 includes the letters T, V, W, X and Y in that order from the concentric 12. A fifth row 43 is present that includes the letters Y and Z. The letters are thus arranged around generally less than 180° of the concentric 12, and are not present upon at least an arc length of 180° about the concentric 12. Number keys 72 are located between the sixth and seventh groupings 24 and 25. The number keys 72 including the numbers 1-5 are on a single multi-tap key, and the number keys including the numbers 6-0 are on a second multi-tap key. Symbol keys 74 are located between groupings 18 and 20, between groupings 16 and 18, and between groupings 14 and 16 and are located at the outer edge of the text entry device 10 remote from the concentric 12. Function keys 76 and a backspace key 78 may also be included and are located at locations farther from the concentric 12 in the radial direction 26 than groupings 14, 16 and 18. Symbol keys 74 including the symbols ?, +, #, *, # and * are on a single multi-tap key. Symbol keys including the symbols !, :, ", $, CAP, and NUM are on a single multi-tap key. Symbol keys 74 including the symbols ",", &, ', c, and BS are on a single multi-tap key. Symbol keys including the symbols ., @, :, ( ), and SYM are on a single multi-tap key. The letter keys of the embodiment may be single tap keys. However, it is to be understood that the arrangement in FIG. 4 can be varied in other embodiments so that any combination of single or multi-tap keys can be employed.

Figure 5:
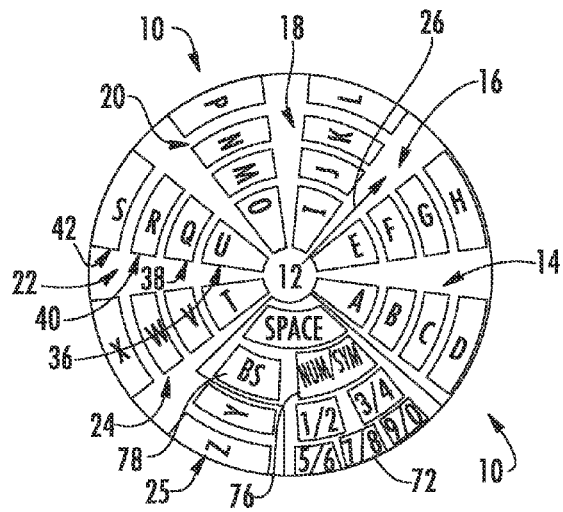
FIG. 5 is a top view of a text entry device in which the concentric does not include a key in accordance with another exemplary embodiment.

An alternative exemplary embodiment of the text entry device 10 is shown in FIG. 5 in which the concentric 12 does not include a space key. In this embodiment, the concentric 12 does not include any keys. The groupings 14, 16, 18, 20, 22, 24 and 25 are arranged as generally described with other previous embodiments. A larger gap is present between the first grouping 14 and the sixth grouping 24 into which the space key and other keys 72, 76 and 78 may be located. These additional keys can be located around the seventh grouping 25 which includes the letters Y and Z. The number keys 72 may be multi-tap keys in which more than one number are assigned to a single key. In this regard, one tap of the key 72 may register the first number while the second tap of the key 72 may register the second number. In accordance with other exemplary embodiments, the number keys 72 may include a single key for each number so that each number has its own key 72. Additional keys may be spaced between the groupings 14, 16, 18, 20, 22, 24 and 25 or they may be only located in the gap formed between the sixth and seventh grouping 24 and 25 and the first grouping 14. In yet other embodiments, an additional large gap may be present between the third and fourth groupings 18 and 20 into which additional non-letter keys can be located. As such, the groupings 14, 16 and 18 can be immediately adjacent to one another and separated from groupings 20, 22 and 24 by way of a pair of gaps that include non-letter keys. In such an arrangement, the groupings 14, 16 and 18 may be on the left side of the layout, and the groupings 20, 22, and 24 (that includes X and Z in the fourth row) may be on the right side of the layout. The pair of gaps may be arranged between the left side and the right side of the layout with one gap at the top of the layout and the other gap at the bottom of the layout with the concentric 12 between. The gap may be filled with non-letter keys and the pair of gaps, and left and right sides of the layout may be symmetrically formed.

Figure 6:
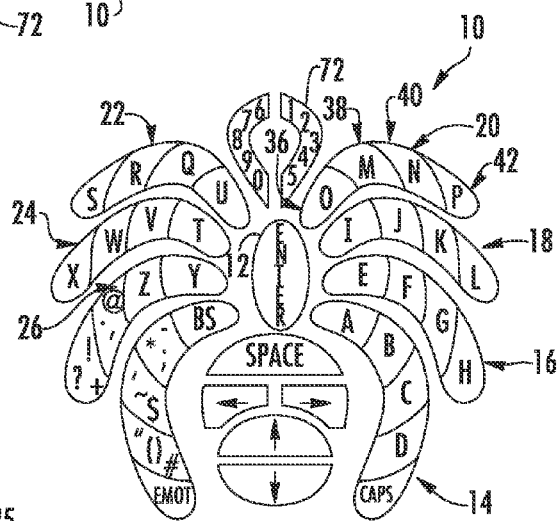
FIG. 6 is a top view of a text entry device in which the letters are configured into the shape of a spider.

The text entry device 10 can be arranged so that the keys are in the shape of a spider or other animal or object. FIG. 6 illustrates one such embodiment in which the groupings 14, 16, 18, 20, 22, 24 and 25 extend from a concentric 12 that includes an enter key. The groupings 14, 16, 18, 20, 22, 24 and 25 make up the legs of the spider and sequential keys are each farther from the concentric 12 so that none of the individual keys of each one of the groupings 14, 16, 18, 20, 22, 24 and 25 is located the same distance from the concentric. The letters Y and Z may be located in the first row 36 and the second row 38 respectively.

Figure 7:
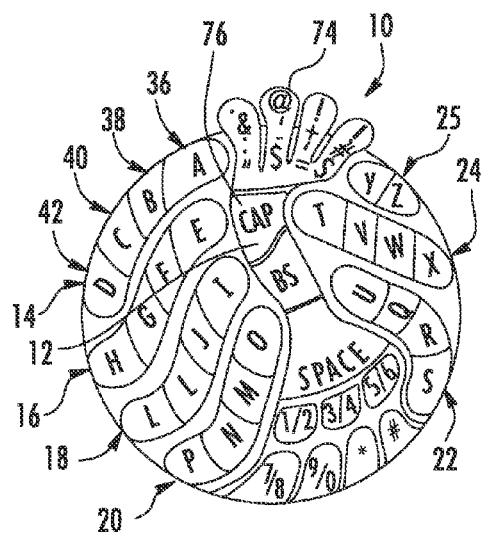
FIG. 7 is a top view of a text entry device in which the letters extend from a concentric that includes symbols, a function key, and a back space key.

FIG. 7 illustrates another exemplary embodiment that again includes groupings 14, 16, 18, 20, 22, and 24 that extend from a concentric 12 that includes a caps key, a back space key and various symbol keys. The Y and Z letters are located in the first row 36 and the second row 38 respectively.

Figure 8:
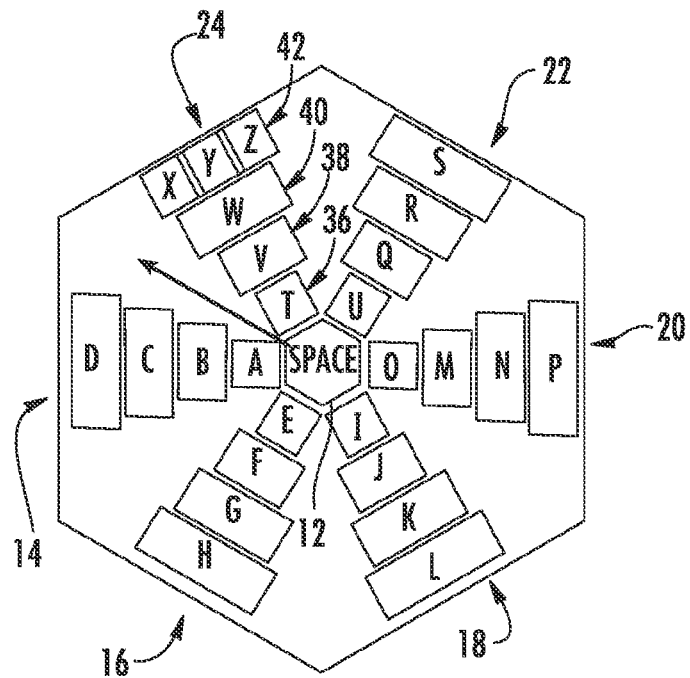
FIG. 8 is top view of a text entry device in accordance with another exemplary embodiment.

FIG. 8 shows an exemplary embodiment similar to FIG. 1 as the groupings 14, 16, 18, 20 and 22 are identical with the exception of the shape of the keys and the angular positions are slightly off. However, a seventh grouping 25 is not present and the sixth grouping 24 includes the letters T, V and W in that order extending from the concentric 12 in the radial direction 26. The letters X, Y and Z are all located radially beyond the letter W and are disposed in the fourth row 42. The letters X, Y and Z are each assigned their own key. However, other embodiments are possible in which a single key is assigned to the letters X, Y and Z so that the single key is a multi-tap key in which the number of taps to the key determine which letter X, Y or Z registers on the text entry device 10. In yet other embodiments, the letter X is assigned to its own single key while the letters Y and Z share a key that is again a multi-tap key.

Figure 9:
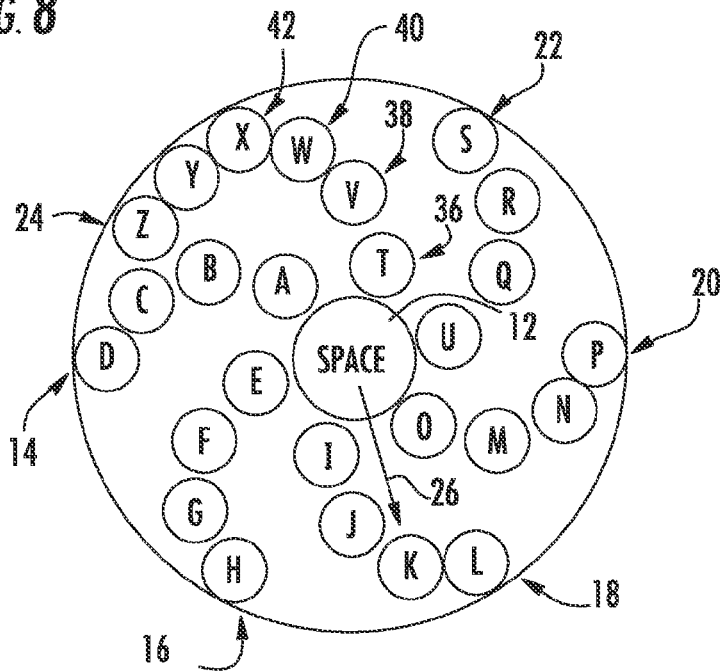
FIG. 9 is a top view of a text entry device in which the groupings extend in a spiral configuration from the concentric.

The text entry device 10 can be fashioned as illustrated in FIG. 9 in which the groupings 14, 16, 18, 20, 22, and 24 do not extend linearly from the concentric 12 but rather are arranged in a spiral manner so that each letter is consecutively farther from the concentric 12 along the particular grouping. As with the embodiment in FIG. 8, the letters X, Y and Z are in the fourth row 42 and are each located along the outer perimeter of the text entry device 10.

Figure 10:
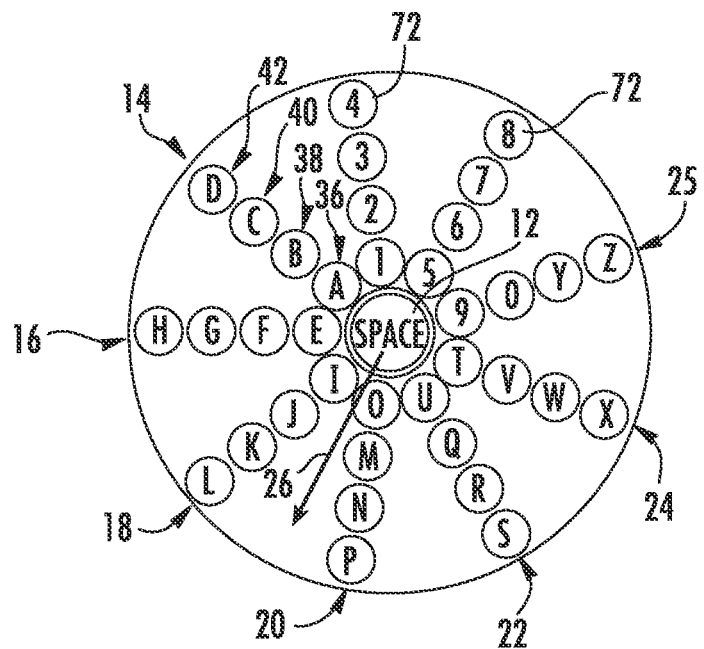
FIG. 10 is a top view of a text entry device in accordance with another exemplary embodiment.

FIG. 10 discloses another exemplary embodiment in which the groupings 14, 16, 18, 20, 22, 24 and 25 are arranged as disclosed with previous embodiments. Number keys 72 can be included in order to fill in the seventh grouping 25 and to define two additional pairs of groupings that in effect fill in the gap present between the first grouping 14 and seventh grouping 25 so that a symmetric text entry device 10 is provided. In another exemplary embodiment, the number keys 72 can be removed, or replaced with other types of keys, and the letter keys may remain.

Figure 11:
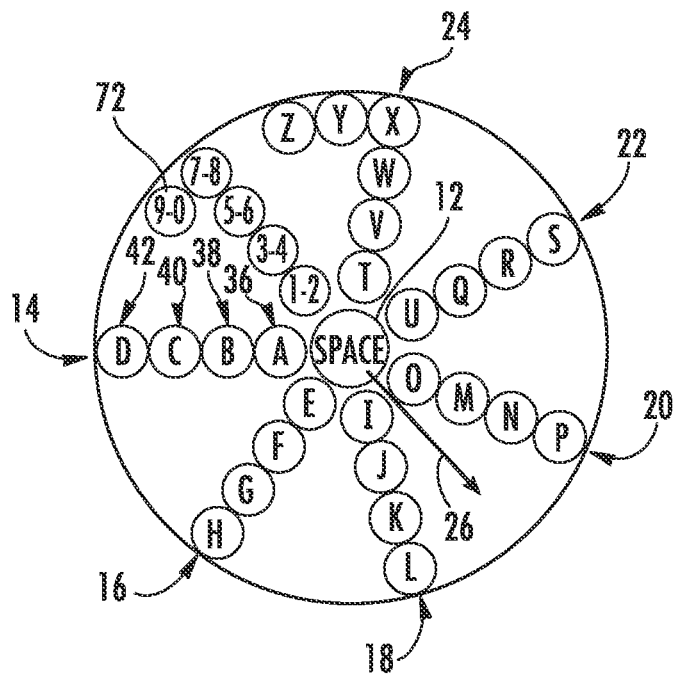
FIG. 11 is a top view of a text entry device in accordance with another exemplary embodiment.

The text entry device 10 of FIG. 11 includes groupings 14, 16, 18, 20 and 22 as previously discussed. Grouping 24 includes letters T, V, W, X, Y and Z in which the letters X, Y and Z are in the fourth row 42. A grouping of multi-tap number keys 72 are located in a gap between the first grouping 14 and the sixth grouping 24. Other exemplary embodiments exist in which an additional grouping of multi-tap symbol keys 74 are likewise located between the groupings 14 and 24 and are arranged with the grouping of number keys 72 so that a generally symmetric arrangement of keys of the text entry device 10 is realized.

FIG. 12 is an exemplary embodiment of the text entry device 10 similar to FIG. 1. However, certain keys are multi-tap keys and include a letter and a number, or include a letter and multiple symbols. A conversion key may be used to obtain desired input from the multi-tap keys, or the multi-tap key may be struck a number of times to achieve the desired text entry. Generally multi-tap keys that have combinations of numbers and symbols actuate the number upon the first tap and the symbols on successive taps, however a conversion key may be first actuated so that strikes on the multi-tap key yield symbols when first struck.

FIG. 13 illustrates an exemplary embodiment of the text entry device 10 in which the keys are shaped differently from one another and are shaped and arranged so as to capture the thumb-print of the user upon being displaced from the concentric 12 during use. The concentric 12 includes a space key and a back space key. The user will generally keep his or her thumb over the concentric 12 in an at rest position. When striking the keys, the user will move his or her thumb some distance from the concentric 12. The size of the portion of his or her thumb striking a particular key will depend upon its location from the concentric 12. As such, the keys may be sized and shaped so as to capture the thumb print of the user upon being displaced from the concentric 12. Four rows 36, 38, 40 and 42 are present and extend in an irregular path about the concentric 12. Letters in the third or fourth rows 40 and 42 may be located at the perimeter although this is not always the case for every letter. The letters Y and Z are located in the third row 40 and the fourth row 42 respectively. Also, the letters in the groupings 14, 16, 18, 20, 22, 24 and 25 do not extend linearly from the concentric 12 but are arranged so that each consecutive letter of a particular grouping is located at a farther distance from the concentric 12.

The keys of the text entry device 10 may be variously shaped in accordance with different exemplary embodiments. For example, the keys may be hemispherically shaped, cylindrically shaped and oriented vertically, cylindrically shaped and oriented horizontally, elliptically shaped, or bar shaped that are straight, curved or angled. Further, the keys may be in the shape of a square, rectangle, triangle, trapezoid, parallelogram, or circle in accordance with various exemplary embodiments.

FIG. 14 illustrates an embodiment in which all of the letters are located on only rows 36 of keys that are immediately adjacent one another. In this regard, the keys are separate keys so that only one key is actuated at a time.

The exemplary embodiment of FIG. 15 includes groupings 14, 16, 18, 20, 22, 24 and 25 that extend in irregular paths from the concentric 12. Additionally, the keys are irregular in shape, and a gap is formed between the first grouping 14 and the seventh grouping 25 into which various keys that are non-letters may be placed as desired.

Figure 16:
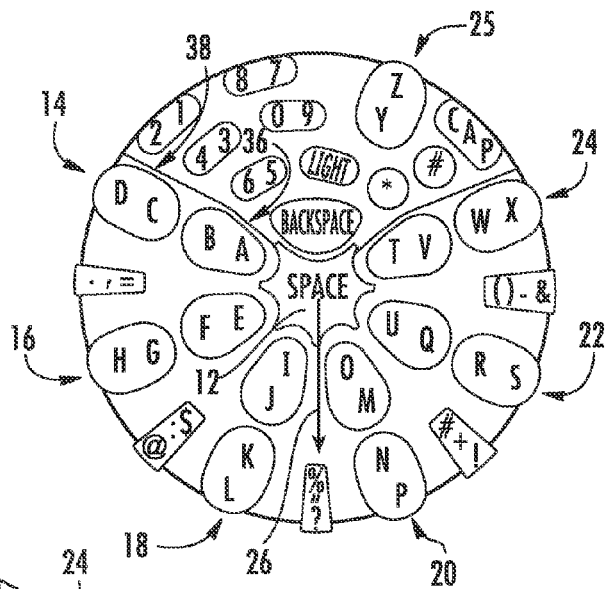
FIG. 16 is a top view of a text entry device in which multi-tap keys are present and two rows of keys with letters exist.

FIG. 16 is an exemplary embodiment in which each grouping 14, 16, 18, 20, 22 and 24 includes two keys that are each multi-tap keys. The keys of the first row 36 include the two letters that are located closest to the concentric 12 in the exemplary embodiment of FIG. 1, and the keys of the second row 38 include the two letters that are located farthest from the concentric 12 in the exemplary embodiment of FIG. 1. A single tap of key 28 may cause an A to be registered while a double tap will cause a B to be registered. A single tap of key 30 may cause a C to be registered while a double tap actuates a D. As such, the order of the letter listed on the key with respect to the concentric 12 may be instructive as to how many taps are needed. Grouping 25 includes a single multi-tap key for letters Y and Z and is arranged in the second row 38 on the perimeter of the text entry device 10.

Figure 17:
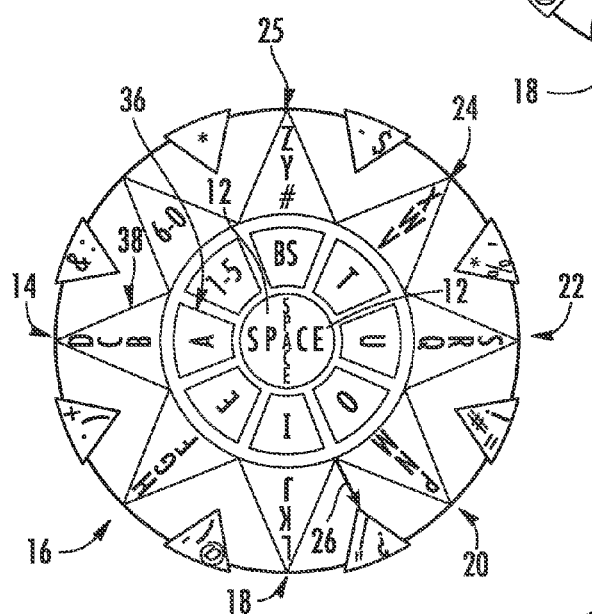
FIG. 17 is a top view of a text entry device in which the first row includes letters assigned to a single key and in which the second row includes letters assigned to multi-tap keys.

FIG. 17 illustrates another exemplary embodiment of the text entry device 10 in which a pair of rows 36 and 38 are present. The first row 36 includes the vowels A, E, I, O and U and the consonant T. The keys of the first row 36 are single tap such that each letter is assigned its own key. The second row 38 includes multi-tap keys to capture the rest of the letters of the alphabet. Each grouping 14, 16, 18, 20, 22, 24 and 25 includes only one multi-tap key so that three letters are assigned to each key. The grouping 25 is an exception in that only two letters, Y and Z, are used although a symbol may also be included as well so that it includes three characters thereon. Number keys 72 also arranged into the first and second rows 36 and 38 can be included and can be between the first grouping 14 and seventh grouping 25 and may be multi-tap keys.

Figure 18:
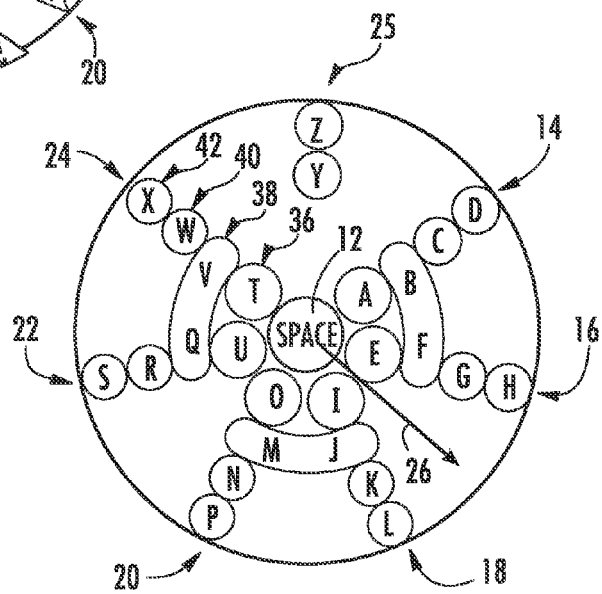
FIG. 18 is a top view of a text entry device in which multi-tap keys span adjacent groupings of letters.

Another exemplary embodiment is shown in FIG. 18 in which multi-tap keys that span adjacent groupings are used. The multi-tap keys are located in the second row 38. In this regard, the letter B of the first grouping 14 shares a key with the letter F of the second grouping 16. Actuation of this multi-tap key a single time may cause the B letter to be registered and actuation a second time may cause the F letter to be registered as B is before F in the alphabet. The other two multi-tap keys may be similarly arranged. An enter key or a timed auto-enter feature may be incorporated into the text entry device 10 when multi-tap keys are used. In accordance with another exemplary embodiment, the groupings 14, 16, 18, 20, 22, 24 and 25 can have their own muti-tap keys. For example, the letters A and D of the first grouping 14 may each have their own key while the letters B and C share a multi-tap key. The other groupings 16, 18, 20, 22 and 24 may be arranged in a similar manner in which only their first and last letters are located on a single key. The letters Y and Z may be located on a single multi-tap key in this exemplary embodiment.

Figure 19:
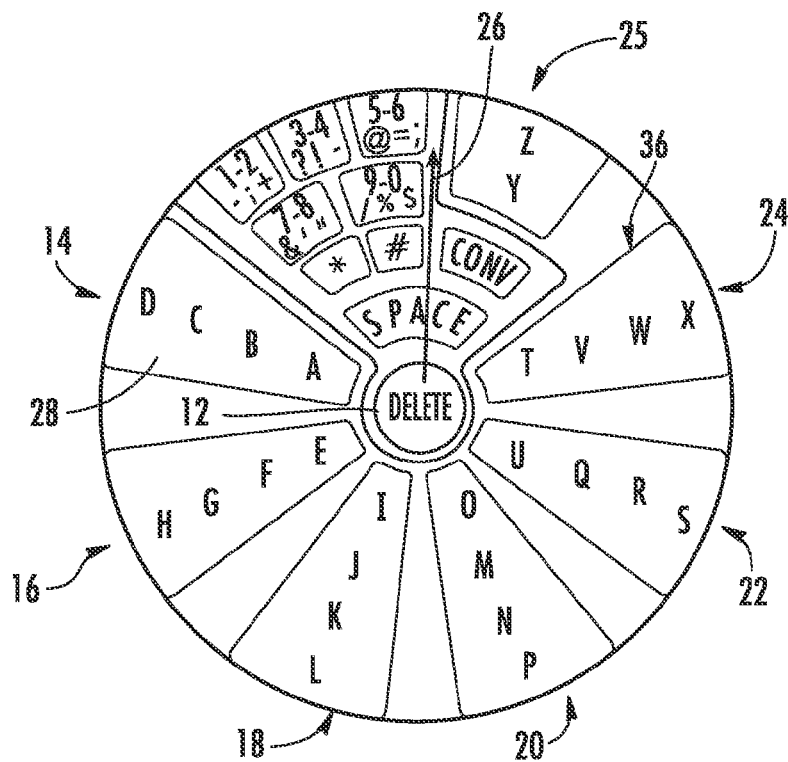
FIG. 19 is a top view of a text entry device in which each grouping of letters is assigned a single multi-tap key.

FIG. 19 shows an exemplary embodiment in which a single row of keys 36 is present and are multi-tap keys. All four letters A, B, C and D are actuated by use of the single key 28. The letters Y and Z are included on a multi-tap key that functions as a double tap key. Non-letter keys may be included in a gap between the first grouping 14 and the sixth and seventh groupings 24 and 25 and may or may not be multi-tap keys.

Figure 20:
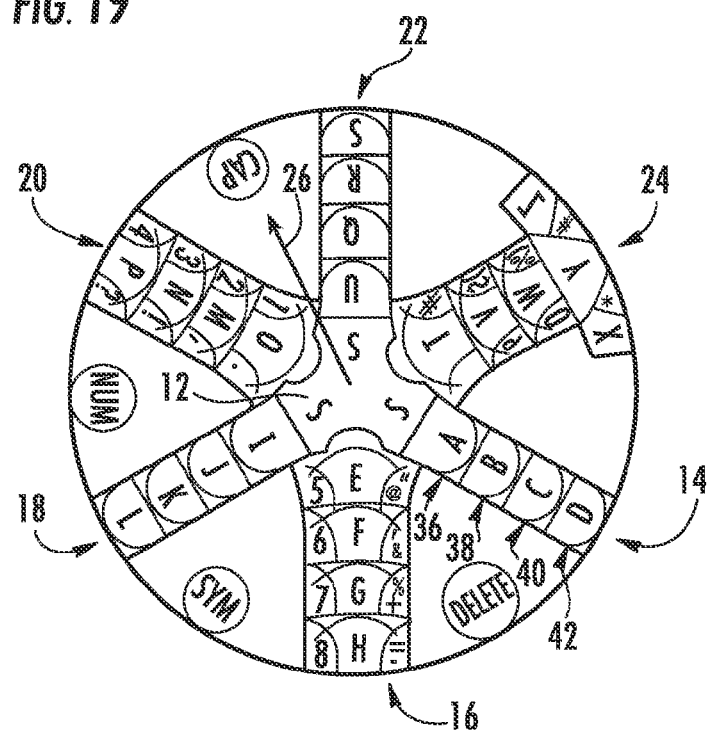
FIG. 20 is a top view of a text entry device in accordance with another exemplary embodiment.

FIG. 20 illustrates an exemplary embodiment in which multi-tap keys are used that include both letters, numbers and symbols. Such an arrangement was previously disclosed with reference to FIG. 12, and a conversion key may be actuated in order to cause a particular multi-tap key to generate a particular letter, number or symbol as listed thereon. Additionally or alternatively, a conversion key need not be used and instead the generated character may be based upon the number of times the multi-tap key is struck.

Figure 21:
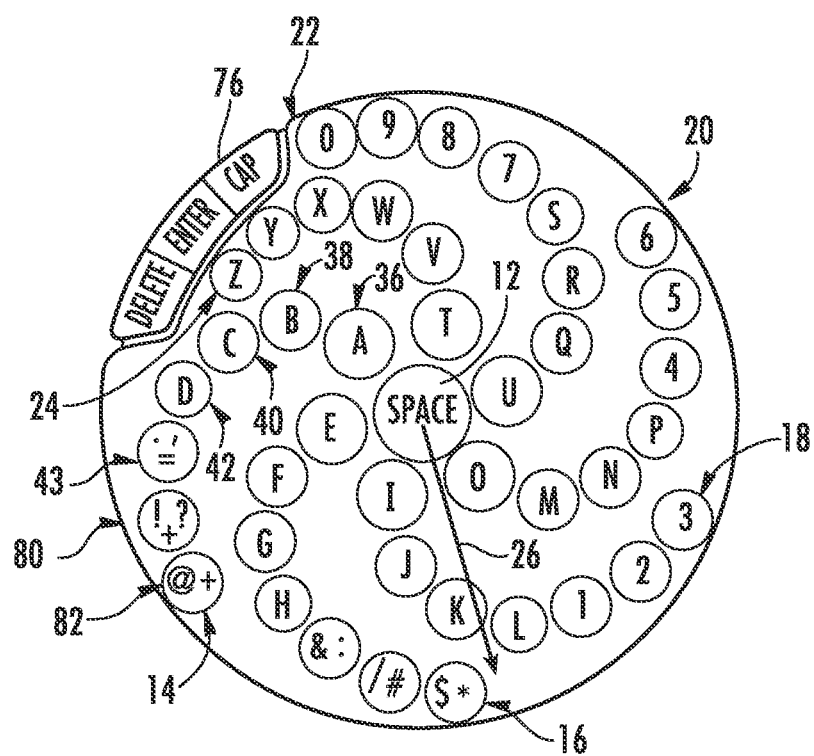
FIG. 21 is a top view of a text entry device in which the groupings are spirally arranged and in which a seventh row of keys is present.

FIG. 21 illustrates an alternative exemplary embodiment of the text entry device 10 in which the groupings 14, 16, 18, 20, 22 and 24 are spirally arranged about the concentric 12. Any number of rows may be used in accordance with various exemplary embodiments. For example, the groupings 14, 16, 18, 20, 22 and 24 may be extended up to seven rows. The first grouping 14 includes letters arranged as in previous exemplary embodiments. However, a fifth row 43 is present that is farther from the concentric 12 along the first grouping 14 and includes a multi-tap symbol key. A sixth row 80 located next in distance from the concentric 12 from the fifth row 43 is present and includes a multi-tap key that features symbols. A seventh row 82 is included and has a multi-tap key that is farther from the concentric 12 than the sixth row 80 along the grouping 14. The fifth grouping 22 includes seven rows in which the numbers 9 and 0 are both located in the seventh row 82 and are positioned along the perimeter of the text entry device 10. Additional function keys 76 can be arranged along the perimeter. As with other exemplary embodiments, the consecutive letters along the groupings 14, 16, 18, 20, 22 and 24 are generally farther from the concentric 12 in the radial direction 26 although this may not be the case with every letter due to the spiral nature of the groupings 14, 16, 18, 20, 22 and 24 in embodiments that include this feature.

Figure 22:
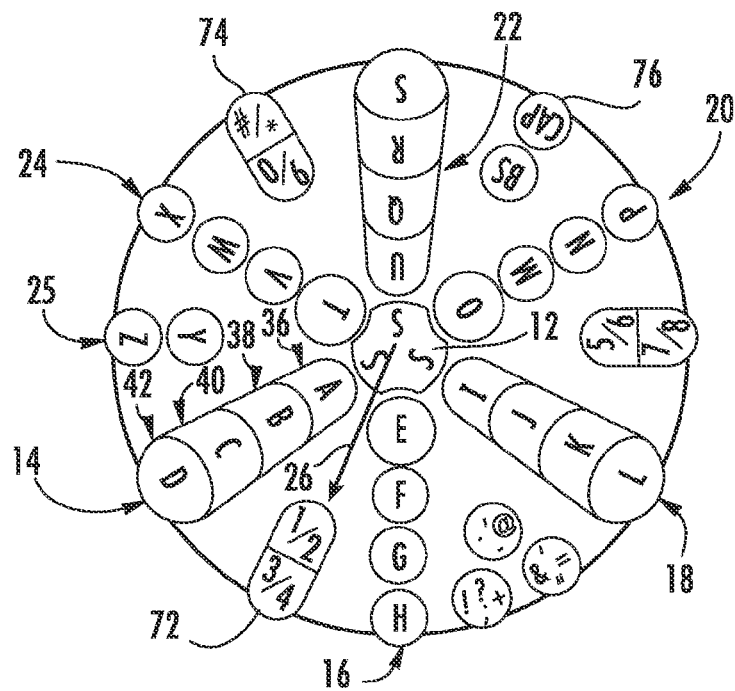
FIG. 22 is a top view of a text entry device in which groupings alternating in the angular direction have different key shapes.

The exemplary embodiment of FIG. 22 includes groupings 14, 16, 18, 20, 22, 24 and 25 that are arranged so as to extend linearly from the concentric 12 with each letter of the groupings 14, 16, 18, 20, 22, 24 and 25 being spaced a different distance in the radial direction 26 from the concentric 12. The first grouping 14, third grouping 18, and fifth grouping 22 have keys that engage one another while the alternate groupings 16, 20, 24 and 25 have keys that are distinct from one another. Number keys 72, symbol keys 74, and function keys 76 extend from the perimeter of the text entry device 10 towards the concentric 12 between the various groupings 14, 16, 18, 20, 22, 24 and 25 as shown in FIG. 22.

The exemplary embodiment of FIG. 22 may also use color to help the user distinguish between groupings 14, 16, 18, 20, 22, 24. For example, primary and secondary colors may be used and each grouping 14, 16, 18, 20, 22, 24 may be provided in a different color. In this regard, primary and secondary colors may alternate around the layout in the circumferential direction. The first grouping 14 may be a primary color, the second grouping 16 may be a secondary color, the third grouping 18 may be a primary color and so forth. In one arrangement, all of the keys of grouping 14 are blue, all of the keys of grouping 16 are green, all of the keys of grouping 18 are yellow, all of the keys of grouping 20 are purple, all of the keys of grouping 22 are red, and all of the keys of grouping 24 are orange. In a different version, the grouping 24 may be purple and the grouping 20 may be orange so that the placement of all of the secondary colors are all between two primary colors that form the secondary colors. The grouping 25 and all of the other keys may be of the same color such as black, white or gray. The concentric 12 may be black or brown.

Figure 23:
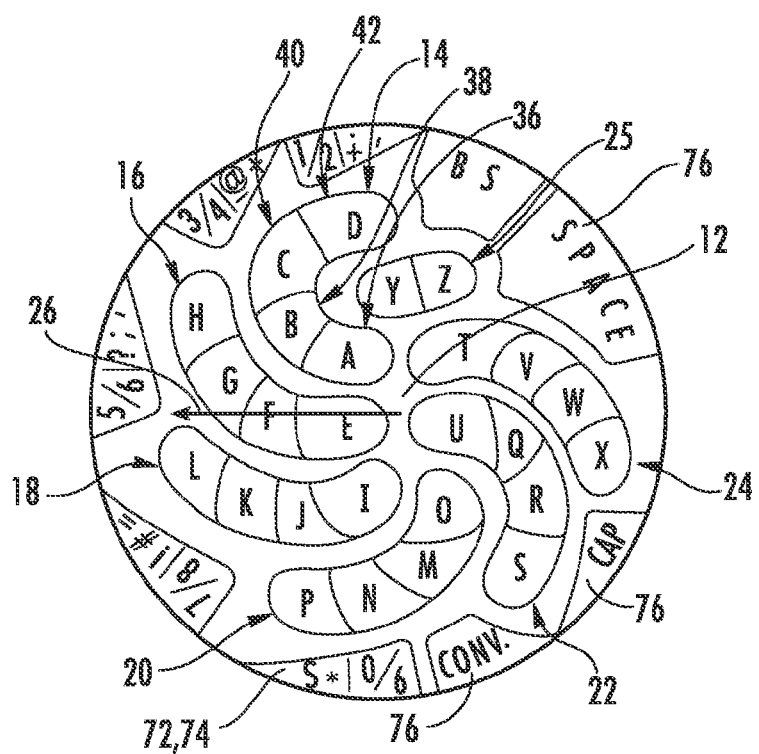
FIG. 23 is a top view of a text entry device in which the groupings have irregular shapes and key shapes.

The exemplary embodiment of FIG. 23 includes a concentric 12 that does not have a key and groupings 14, 16, 18, 20, 22, 24 and 25 that extend in curved arrangements from the concentric 12. Each letter of the individual groupings 14, 16, 18, 20, 22, 24 and 25 is located a different distance from the concentric 12 in the radial direction 26. Four rows 36, 38, 40 and 42 are present such that each one of the letters in the groupings 14, 16, 18, 20, 22, and 24 is located in a different one of the rows 36, 38, 40 and 42 depending upon their consecutive distance from the concentric 12. The letters Y and Z may be located in the third row 40 and fourth row 42 respectively. All of the other non-letter keys are located at the perimeter. Certain keys are multi-tap such as the combined number keys 72 and symbol keys 74, while other keys such as the illustrated function keys 76 are single assigned.

The concentric 12 can be either symmetrical or asymmetrical in shape. The concentric 12 in FIG. 23 is asymmetrical and extends from the base of the Y key to the base of the O key. As such, the concentric 12 need not be a single point but can be elongated and may extend along any portion of the keypad surface of the device.

Figure 24:
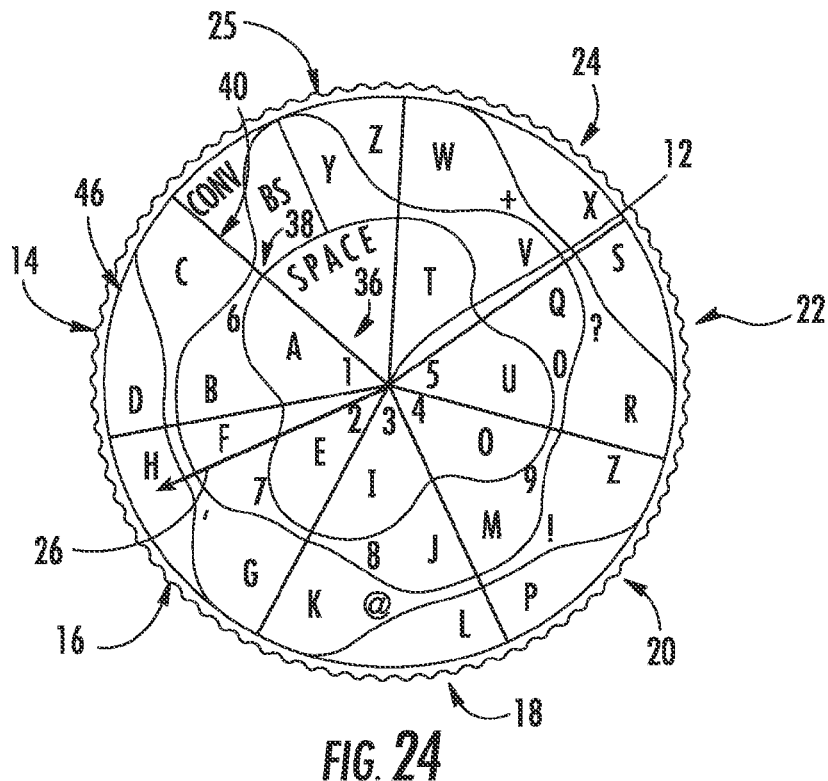
FIG. 24 is a top view of a text entry device with keys arranged in a pie like configuration.

Another exemplary embodiment of the text entry device 10 is shown in FIG. 24 in which the keys are divided up into sections that are pie shaped and the same size. The letters on the fourth row 42 are located at the perimeter. Certain keys are multi-tap, and certain keys that are non-letter keys are single assigned. The letters Y and Z are in the third and fourth rows 40 and 42 respectively.

Figure 25:
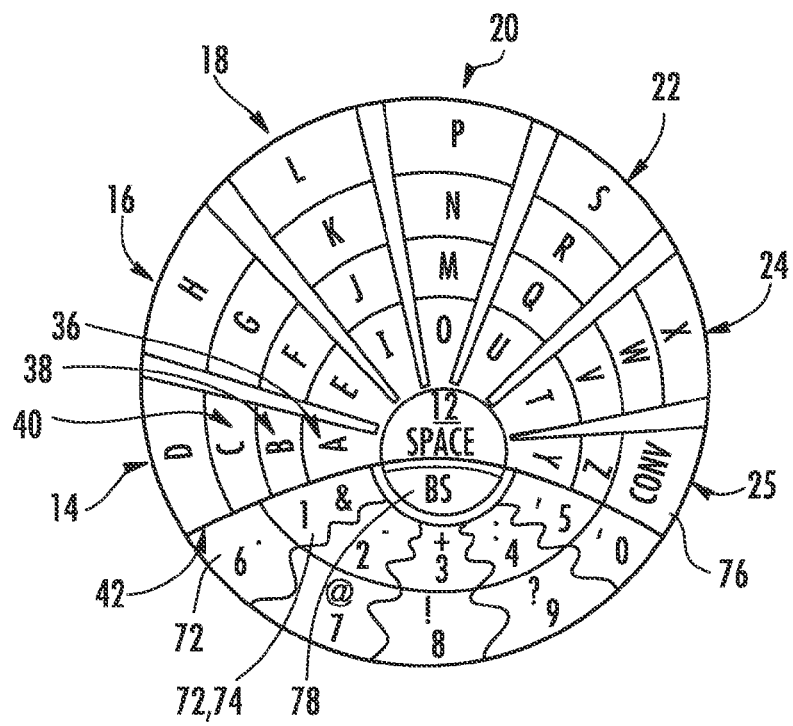
FIG. 25 is a top view of a text entry device with keys arranged in a sunrise configuration.

The text entry device 10 can be arranged so that the keys are arranged to form various items. FIG. 25 is one example in which the keys are arranged in the form of a sunrise. The groupings 14, 16, 18, 20, 22, 24 and 25 are shaped and sized so as to be rays of the sun, non-letter keys 72, 74 and 76 are shaped and sized so as to be reflections off of water, and the concentric space key 12 is shaped and sized to be the sun rising over a body of water. A gap is thus made in the angular direction between grouping 14 and grouping 25 into which the non-letter keys 72, 74 and 76 are disposed. Other arrangements of the text entry device 10 are possible in which the keys are arranged to be in the shape of a spider web, eagle, hawk, palm tree, or other object or animal. The keys may be arranged in the likeness of a person, plant, celestial body, machine, building, structure, logo, ascot, hobbies, club, religion, event, or holiday in other exemplary embodiments.

Figure 26:
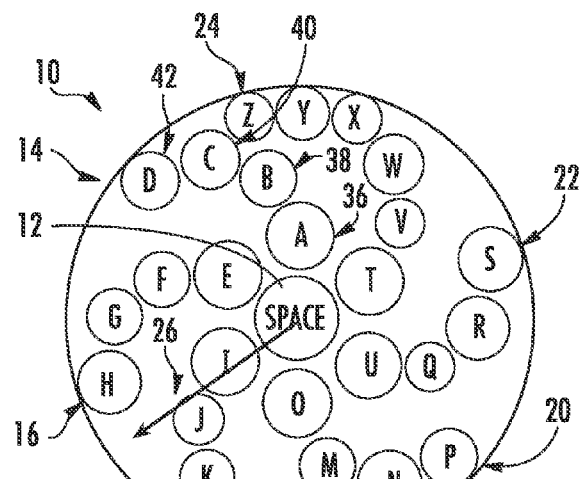
FIG. 26 is a top view of a text entry device in which in the keys containing the letters are sized based upon letter frequency usage.

FIG. 26 illustrates an alternative exemplary embodiment in which the groupings 14, 16, 18, 20, 22, and 24 are spiral in shape, as other embodiments, and in which certain letters are on keys that are larger than the keys onto which other letters are located. The letters of the first row 36 are sized so that none of the other letters are larger. The letters can be sized so that more frequently used letters are larger than those that are less frequently used. For example, the keys having the letters V, Q and X are smaller than the keys having the letters L, N and P. The keys may be grouped into any number of groups of size based on usage. The other previously discussed embodiments in which the keys are shaped and sized based on thumb or finger print may also be provided so that the frequency of usage of the letters on the keys is taken into account when sizing the keys. In other embodiments, the size and shape of the key is selected based upon the usage frequency of the letter included with the key.

Figure 27:
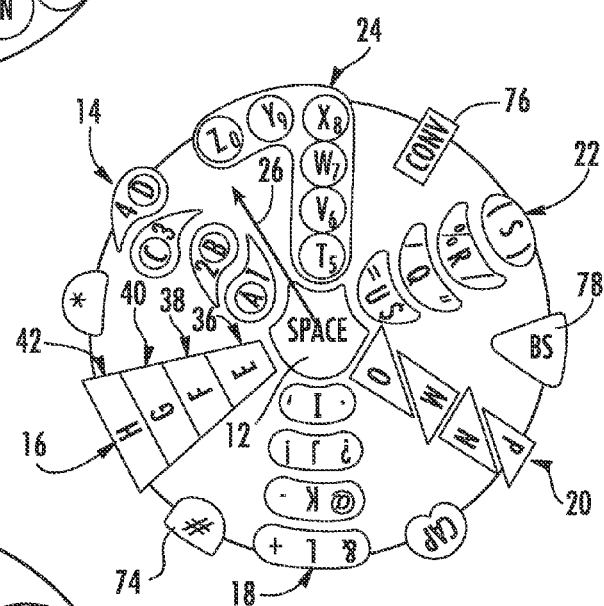
FIG. 27 is a top view of a text entry device in which each grouping of letters has keys with unique shapes.

The exemplary embodiment in FIG. 27 includes groupings 14, 16, 18, 20, 22, and 24 that each have keys that are differently shaped from one another. In this regard, the groupings 14, 16, 18, 20, 22, 24 and 25 have keys with unique shapes and sizes. The use of different shaped keys for each grouping 14, 16, 18, 20, 22, 24 and 25 may allow the user to more easily identify a desired key by way of tactile sensation without having to look at the text entry device 10.

Color may also be used to allow the user to more easily distinguish keys in groupings 14, 16, 18, 20, 22, 24 and 25 from one another. For example, the keys of each grouping 14, 16, 18, 20, 22, 24 and 25 may be assigned a different color so that they are more easily distinguishable from one another. In accordance with one exemplary embodiment, the primary colors of red, blue and yellow are used on alternating groupings 14, 16, 18, 20, 22, 24 and 25 in the angular direction about the concentric 12. Secondary colors are used for the groupings 14, 16, 18, 20, 22, 24 and 25 between those that have primary colors. For example, in one exemplary embodiment grouping 14 is red, grouping 18 is blue, and grouping 22 is yellow. Those between groupings 14, 18 and 22 are made of secondary colors such that grouping 16 is green, grouping 20 is purple, and grouping 24 is orange.

Figure 28:
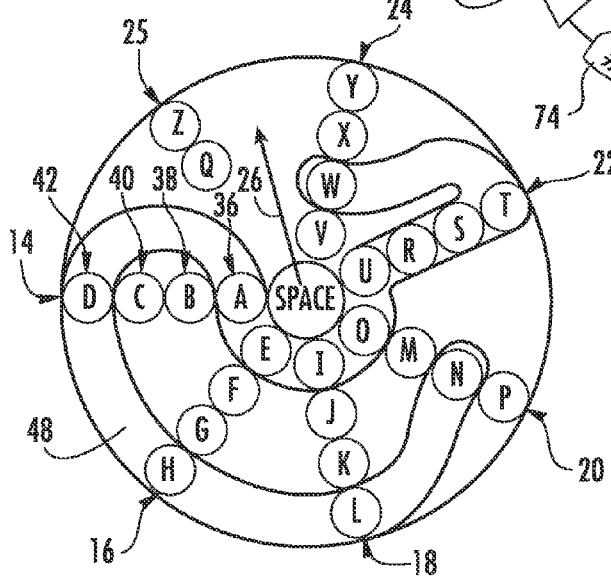
FIG. 28 is a top view of a text entry device in which a color weave is used to distinguish certain letters.

FIG. 28 shows another exemplary embodiment in which color is used to distinguish certain letters. The letters chosen for being accentuated by color may be those letters more commonly used when entering text. A color weave 48 is present on the text entry device 10 and features one or more colors that function to draw attention to those letters within the color weave 48. Those letters outside of the color weave 48 are associated with less pronounced coloring such as black, white, gray, or cream so that the user notices a distinction between the letters found within the color weave 48, which may be primary colors, and those outside of the color weave 48. The color weave 48 may include the portion of the text entry device 10 that surrounds the letters on the base of the keypad, commonly known as the keybed, or may form part of the keys onto which the letters are located. The color weave 48 may be customizable by the user. In this regard, the user can place or arrange the color weave 48 so that it is associated with letters or numbers the user desires. As such, the letters shown in FIG. 28 in association with the color weave 48 are only exemplary and others are possible in accordance with other embodiments.

The color weave 48 can be a ribbon or tape that is printed or painted, molded into, or applied to the surface upon which the keys having the letters are mounted. The color weave 48 may take a variety of shapes. For instance, the color weave 48 can be circular in nature and surround letters on keys that are likewise circular in nature. The color weave 48 may highlight the ten most frequently used letters in accordance with one embodiment. Although shown as being continuous, the color weave 48 may be made of several separate segments and can transition from being bright colors associated with the most commonly used letters to colors of lesser brightness of letters less frequently used. In accordance with one exemplary embodiment, primary colors are used in the color weave 48 to highlight vowels and the letter T while secondary colors are used for other less commonly used consonants which may be the letters D, H, L and N. The letters found within the color weave 48 may be the letters A, D, H, L, N, E, I, O, U, R, S, T, and W and may extend between different groupings 14, 16, 18, 20, 22, 24 and 25.

Figure 29:
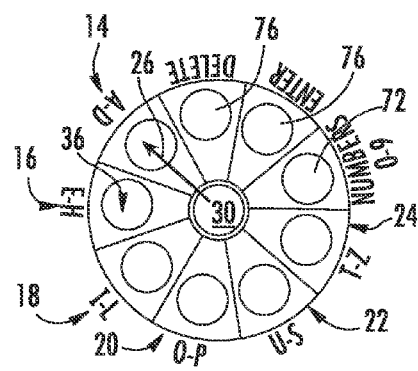
FIG. 29 is a top view of a text entry device that is micro-sized.

The text entry device 10 may also be arranged in a micro-size format with keys that can be actuated through the use of a pen or pencil tip, a stylus, or bent paper clip. The text entry device 10 may have a diameter that is from 5/16" to 3/8" in one exemplary embodiment. In accordance with another exemplary embodiment, the diameter of the text entry device 10 may be up to 1/8". FIG. 29 illustrates an exemplary embodiment of the text entry device 10 when used in micro size. A space key is located at the concentric 12, and multi-tap keys are used in the groupings 14, 16, 18, 20, 22 and 24 due to size constraints as single keys for single letters may be difficult to actuate. The letters are all thus found within a single row 36 and the keys themselves are not numbered but rather the area adjacent the keys to inform the user of the input upon actuating a particular key. Color and/or division lines may be used to distinguish the groupings 14, 16, 18, 20, 22, and 24 from one another.

Figure 30:
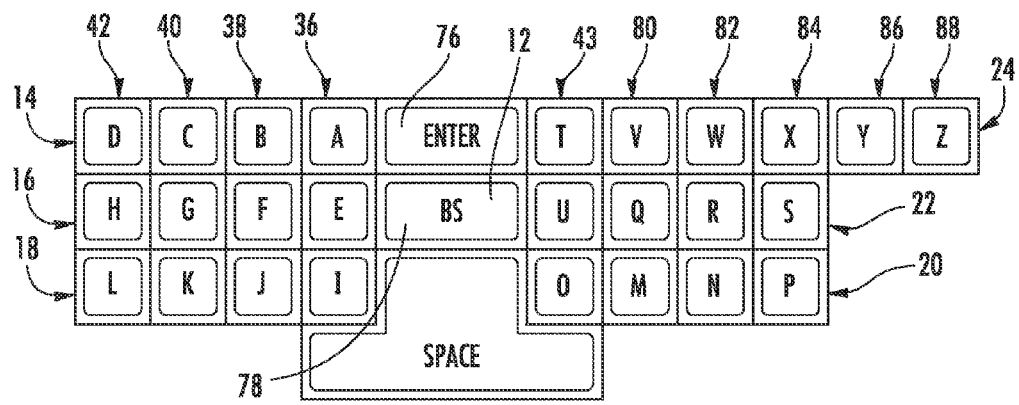
FIG. 30 is a top view of a text entry device in which the groupings extend linearly but not in an angular direction from the concentric.

An alternative exemplary embodiment is illustrated in FIG. 30 in which the concentric 12 includes an enter key, a backspace key 78, and a space key. The letters extend linearly from the concentric 12 but are not disposed in an angular fashion about the concentric. Each letter of each of the groupings 14, 16, 18, 20, 22 and 24 is located a farther distance away from the concentric than the adjacent letter of that grouping 14, 16, 18, 20, 22 and 24. An eighth row 84 is present that includes letters X, S and P. A ninth row 86 includes the letter Y and a tenth row 88 includes the letter Z. The letters in each row 36, 38, 40, 42, 43, 80, 82, 84, 86, and 88 are all equally distant from the concentric 12 as the other letters of that particular row 36, 38, 40, 42, 43, 80, 82, 84, 86, and 88 if any.

Figure 31:
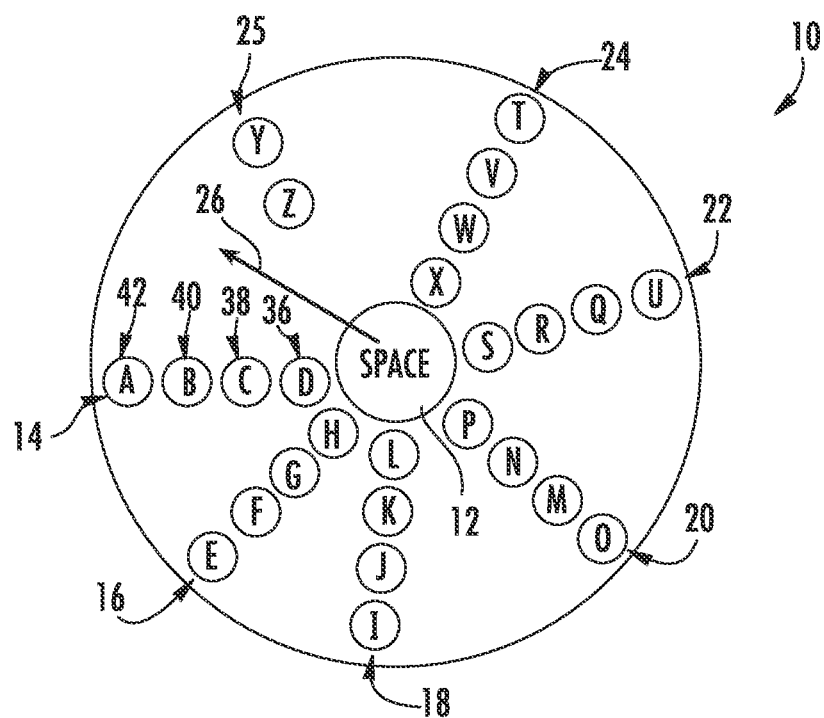
FIG. 31 is a top view of a text entry device in which none of the vowels are located closer to the concentric than any of the consonants.

FIG. 31 illustrates an alternative exemplary embodiment that is the same as that described in relation to FIG. 1, but in which all of the letters are reversed in their order in the radial direction 26 from that shown in FIG. 1. For example, the letters D, C, B and A in that order extend from closest to the concentric 12 to farthest from the concentric 12 in the radial direction 26. The vowels are thus arranged on the outer perimeter of the text entry device 10 and none of the vowels are located closer to the concentric 12 than any of the consonants. However, the consonant T is located the same distance from the concentric 12 as the vowels.

Figure 32:
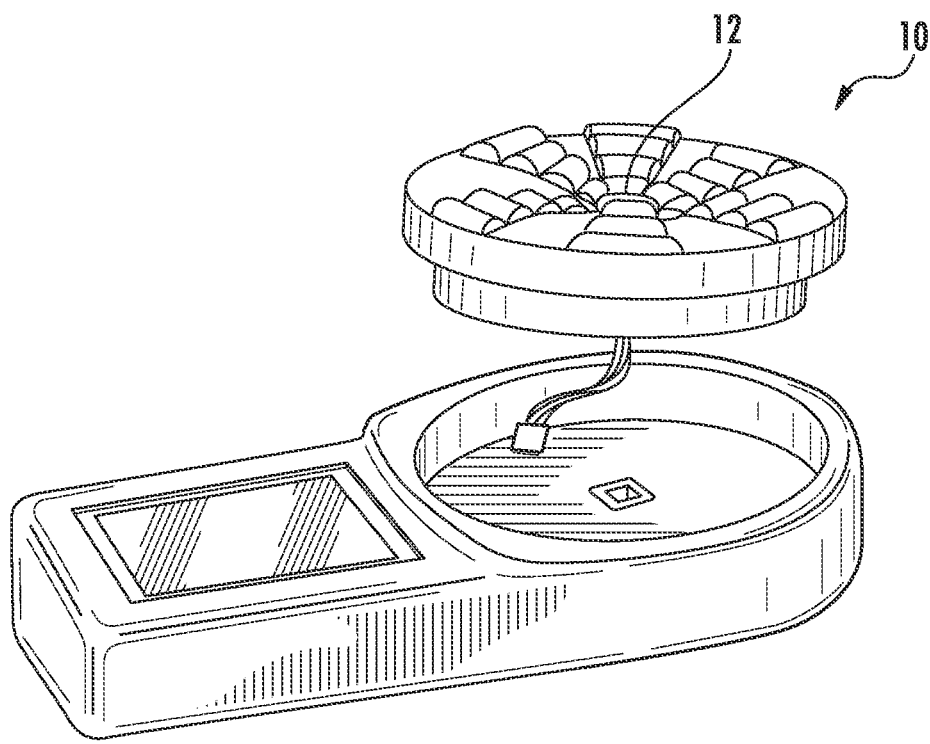
FIG. 32 is a perspective view of a text entry device in accordance with another exemplary embodiment.

The text entry device 10 may be arranged into a unit so that a keybed 92, keys, sensors and support electronics are housed into a rounded or angled unit that resembles a disc. The text entry device 10 can be connected to a host device 90 as illustrated in FIG. 32. Communication to the host device 90 can be effected through the use of a wire with a plug, pins or blades, a USB port, or a wireless connection. A flexible data transfer tape or strip with a plug on one end as illustrated in FIG. 32 can also be used. The text entry device 10 can be rotatable, removable, and replaceable with respect to the host device 90. The host device 90 can have a cavity that is shaped to receive the text entry device 10 and into which the text entry device 10 can be disposed and retained. Any suitable connection can be used to attach the text entry device 10 to the host device 90 such as by means of snaps, screws, pins, blades, friction, or mechanical fasteners. As stated, the text entry device 10 can be rotated with respect to the host device 90 to satisfy user preference. The rotation ability of the text entry device 10 may be achieved by the user picking up and manually rotating the text entry device 10 and then placing the text entry device 10 into communication with the host device 90 through engagement of the plug, pins or blades, USB port, wireless connection, or flexible data strip. The text entry device 10 may thus be swapped for another to be then inserted into the host device 90 in order to allow for use with different applications, user preferences, or in a training type mode in which more advanced text entry device 10 layouts are used as the user gains familiarity with more basic text entry device 10 layouts. The user may move from a strong functional visual text entry device 10 and once becoming proficient with same, may change to a more tactile based text entry device 10 for no-look texting. The text entry device 10 may also be changed to achieve different designs, themes or colors as desired. The host device 90 may be any electronic device that needs text entry. The host device 90 may be a cell phone, computer mouse, camera, gaming console, GPS device, language translator, PDA, portable keyboard, remote control, or a key fob in accordance with certain exemplary embodiments.

Figure 33:
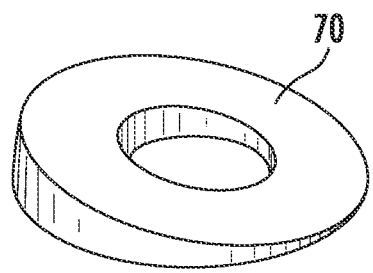
FIG. 33 is a perspective view of a wedge.

An angled wedge 70 as shown in FIG. 33 can be included and may be placed between the text entry device 10 and the host device 90. The angled wedge 70 changes the orientation of the keys of the text entry device 10 as presented to the user when utilized so that greater user comfort is realized. The user may remove the angled wedge 70 if desired to thus change back the angular relationship of the keys. The wedge 70 can likewise be rotated with respect to the host device 90 so that the angle of inclination realized by the text entry device 10 is likewise rotated as per user preference. The wedge 70 may be a completely separate component from the text entry device 10 or may be formed integrally therewith so that they form a single, non-detachable component. In one embodiment, five different wedges 70 can be provided to the user so that the user may select one of these wedges 70 to use to achieve a desired angle of inclination.

Figure 34:
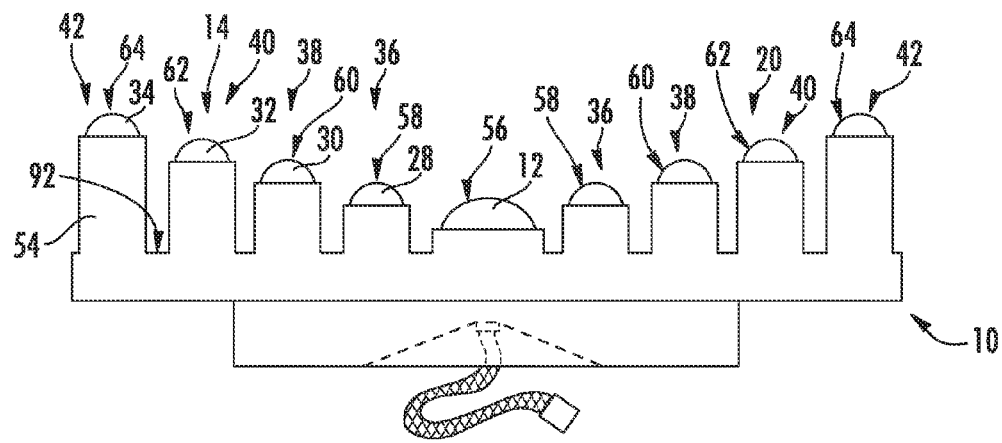
FIG. 34 is a side view of a text entry device with keys that have convex shaped surfaces with groupings arranged in a concave shape.

In accordance with certain exemplary embodiments, the text entry device 10 can be in the shape of a concave bowl. In this regard, the first row 36 may have a height that is lower than the second row 38. FIG. 34 shows an exemplary embodiment in which the letters are located on keys that have curved upper surfaces. The upper surfaces 58 of the keys of the first row 28, which are shown in FIG. 33 as including the first grouping 14 and the fourth grouping 20, are located at a height from the keybed 92 that is lower than the height of the upper surfaces 60 of the keys of the second row 38. The upper surfaces 58 are higher than the upper surface 56 of the concentric 12. The upper surfaces 62 of the keys of the third row 40 are higher than the upper surfaces 60 of the second row 38. Additionally, the upper surfaces 64 of the keys of the fourth row 42 are higher than the upper surfaces 62 of the keys of the third row 40. Collars 54 may extend from the keybed 92 and be of different heights in order to cause the keys for the letters to thus be at different heights. The rows 36, 38, 40 and 42 are thus arranged so that they extend upwards from the concentric 12 in the radial direction 26 away from the concentric 12 to result in upper surfaces of the keys of the letters being in a concave bowl-like shape. The rows 36, 38, 40 and 42, may be arranged completely around the concentric 12 so that a bowl shape is realized instead of simply a concave shape. This height variance may provide for increased tactile sensation and key strike efficiency of the user and may accommodate a wide range of thumb sizes. The concave bowl shape may provide for more efficient striking of the keys by the user as the keys may be more quickly struck with less errors being made by striking adjacent keys. Further, the groupings of letters and their arrangements may result in faster and more efficient entry of text during use of the text entry device 10.

Figure 35:
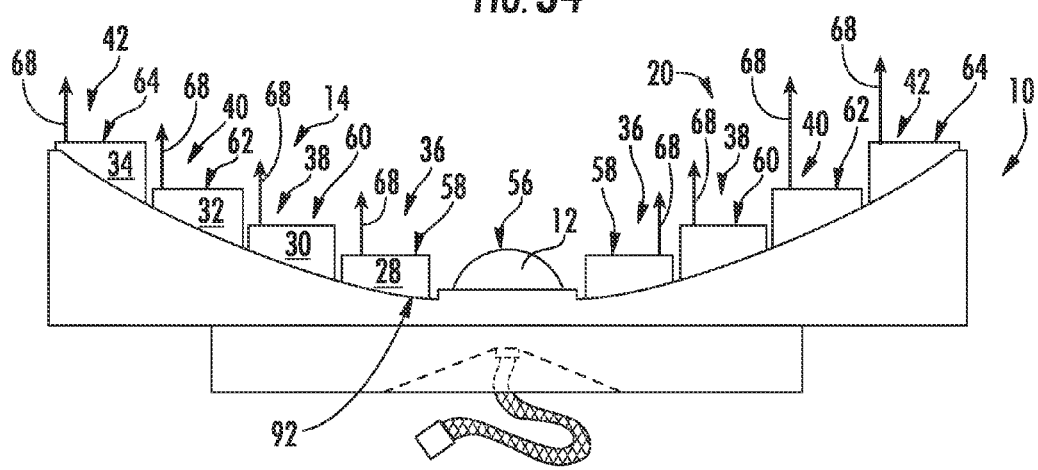
FIG. 35 is a side view of a text entry device with keys that have flat upper surfaces with groupings arranged in a concave shape.

An alternative exemplary embodiment is shown in FIG. 35 in which the upper surface 56 is higher than the upper surfaces 58. The upper surfaces 58, 60, 62 and 64 are flat with surface normals 68 that extend vertically with no horizontal component. The upper surfaces 60 are higher than upper surfaces 58 and upper surface 56. The upper surfaces 62 are higher than upper surfaces 60, and upper surfaces 64 are higher than upper surfaces 62. As shown, the keybed 92 is convex and bowl shaped so that the upper surfaces 58, 60, 62 and 64 extend generally the same amount from the keybed 92. However, the elevation (height) of the upper surfaces 58, 60, 62 and 64 may be measured by their distance from the upper surface 56 of the concentric 12, or may be measured by their distance with respect to the thumb of the user when resting on the upper surface 56, or may be measured by their vertical elevation towards or away from the user of the text entry device 10. The upper surface 56 may be at the lowest point with respect to any of the other keys in accordance with certain exemplary embodiments. In other embodiments, the outermost row is located at the highest elevation. Although shown as having upper surfaces 58, 60, 62 and 64 at different heights, it is to be understood that other arrangements are possible in which some of the upper surfaces 58, 60, 62 and 64 are located at the same height. As used herein, the elevation or height may be measured from the central location of the upper surfaces 58, 60, 62 and 64. In other arrangements, the height or elevation of the upper surfaces 58, 60, 62 and 64 may be measured from their outer edges.

Figure 36:
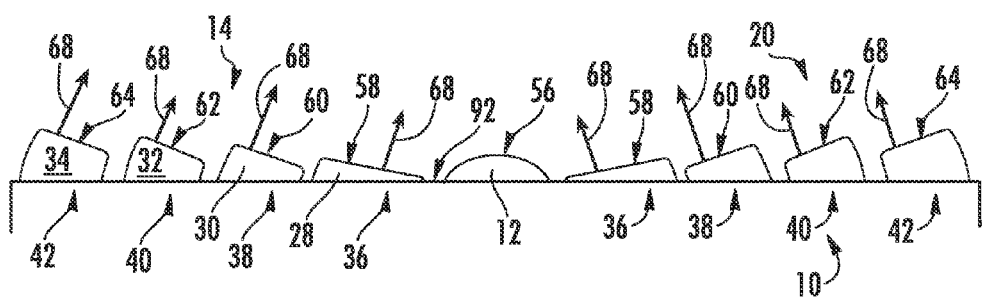
FIG. 36 is a side view of a text entry device with keys that have surface normal that are not parallel to a surface normal of a base of the keyboard.

FIG. 36 illustrates another alternative exemplary embodiment in which the keys are angled with respect to a keybed 92. The upper surfaces 58, 60, 62 and 64 have surface normals 68 that have a horizontal component and that point in the general direction towards the concentric 12 when viewed from above. Other arrangements are possible in which the surface normals 68 have a horizontal component that causes them to point away from the concentric 12 when viewed from above.

Figure 37:
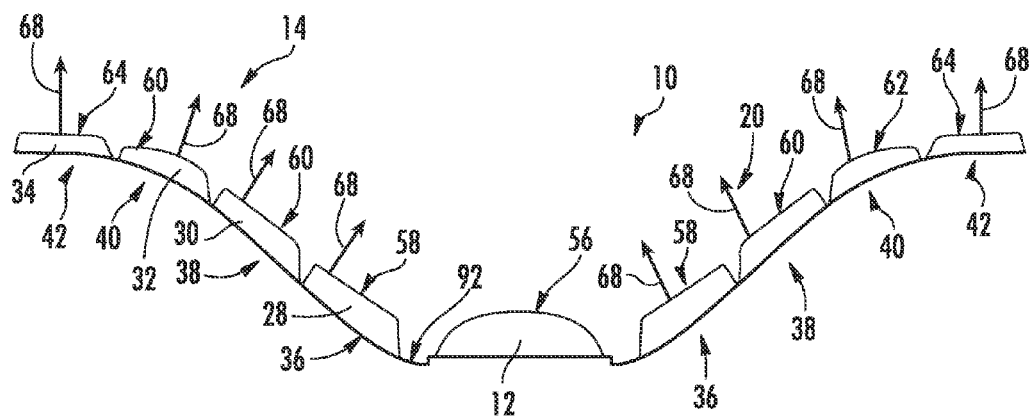
FIG. 37 is a side view of a text entry device with sides that ascend from the centric in a varying rate.

The text entry device 10 of FIG. 37 includes upper surfaces 64 that have surface normals 68 pointing vertically upwards with no horizontal component, while the surface normals 68 of the other upper surfaces 58, 60 and 62 have a horizontal component and point towards the concentric 12 when viewed from above. The elevation of the rows 36, 38, 40 and 42 is also varied such that the elevation becomes higher from rows 36 to 38 to 40 to 42. The rate of elevation increase is largest between row 36 and row 38. The rate of elevation increase is the least between row 40 and row 42 so that these rows 40 and 42 have elevations that are fairly close to one another. The elevation increase from row 38 to row 40 is intermediate such that the overall rate of elevation increase starts out sharply close to the concentric 12 and then tapers off along the radial direction 26 although it is not a consistent tapering from the concentric to the outer perimeter. The keybed 92 can be arranged in this elevation profile, or collars 54 can be employed as disclosed with other exemplary embodiments.

Figure 38:
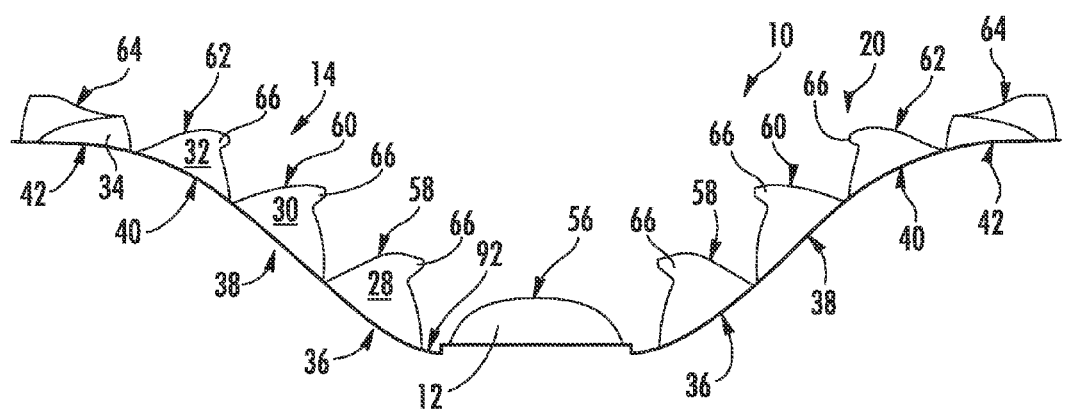
FIG. 38 is a side view of a text entry device with groupings that are arranged in a concave shape that ascend at varying rates and with keys that have tips.

FIG. 38 discloses an exemplary embodiment that is similar to that previously discussed with respect to FIG. 37. However, the upper surfaces 58, 60 and 62 are provided with tips 66 to aid the user in striking the keys. The raised tips 66 extend from the upper surfaces 58, 60 and 62 at the point of the upper surfaces 58, 60 and 62 closest to the concentric 12. The upper surfaces 64 may be provided with tips 66 in a similar manner in accordance with other exemplary embodiments.

Other exemplary embodiments may include raised, tactile bars that are located between adjacent groupings 14, 16, 18, 20, 22, 24 and 25 that are present in order to highlight the division between the groupings 14, 16, 18, 20, 22, 24 and 25 and to afford the user with a tactile dividing line when entering text without looking at the text entry device. The raised, tactile bars can be a single continuous bar or may be segmented. The raised tactile bars may be linear and extend from or be adjacent the concentric 12 or may be shaped so as to generally mimic the shape of the grouping 14, 16, 18, 20, 22, 24 and 25 to which it is associated. The raised tactile bars may be molded onto the bed the keys extend from or may be attached thereto.

Although described as being used in conjunction with a physical text entry device 10, the disclosed letter arrangements and other features may be incorporated into a soft keyboard or virtual keyboard in other exemplary embodiments. As such, it is to be understood that the text entry device 10 may be a soft keyboard or virtual keyboard and need not be a physical device in other embodiments. Text entry device 10 may be varied so as to include different languages such as English, Spanish, Latin, French, Italian, Portuguese and Romanian.

Figure 39:
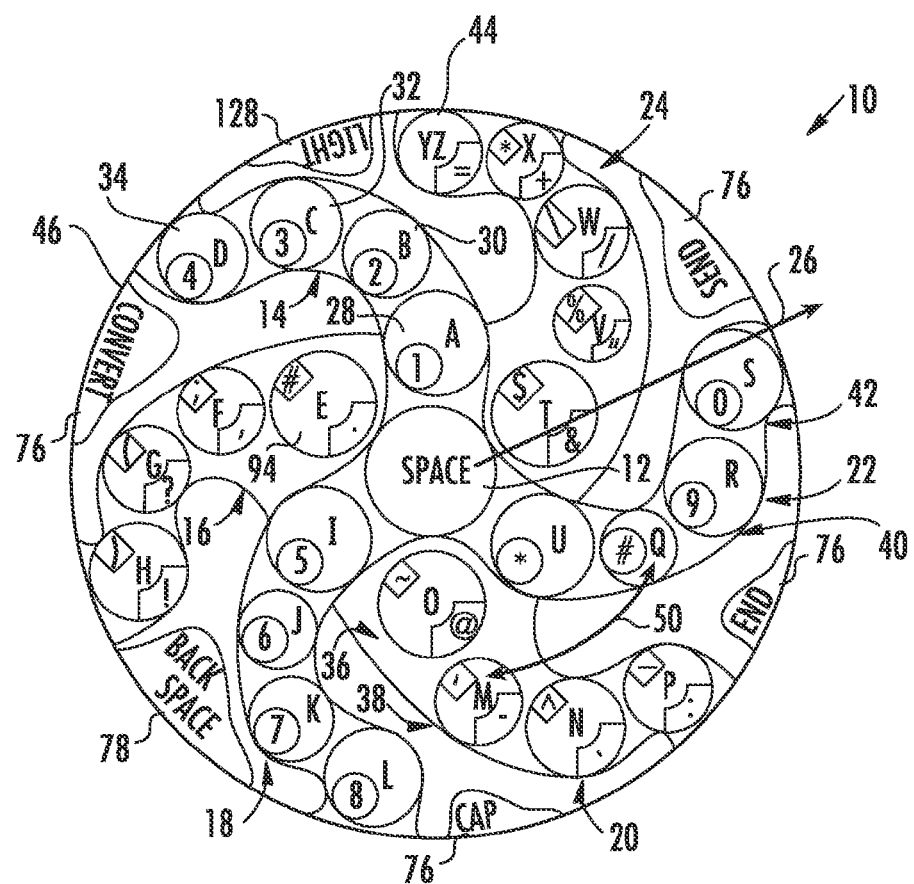
FIG. 39 is a top view of a text entry device with groupings that are arranged in a spiral configuration with respect to the concentric.

Another exemplary embodiment of the text entry device 10 is shown with reference to FIG. 39. The keys are in groupings that are arranged in a spiral configuration about the concentric 12 at which a space key is located. The groupings all have at least one key a portion of which is located at a different angular position about the concentric 12 than at least a portion of one of the other keys of one of the other groupings. For example, the first grouping 14 has a key 28 associated with the letter A. A portion of key 28 is located at a first angular position 44. The second grouping 16 has a key 94 associated with the letter E and a portion of key 94 is located at a second angular position 46 about the concentric 12 that is at a different position in the angular direction than the first angular position 44. However, with the spiral configuration some portions of the keys may share the same angular position. For example, key 94 and key 34 have portions that share the same angular position due to the curvature of the first grouping 14. However, in some instances all of the portions and all of the keys of each one of the groupings 14, 16, 18, 20, 22 and 25 may be at completely unique angular positions such that none share the same angular position.

The groupings may extend so as to be located completely 360° about the concentric 12. The keys of the groupings may be physical in that they are actually touched by the user to cause actuation. In this regard, the text entry device 10 is not a soft keypad but an actual keypad that is contacted and struck by the user. All of the keys have letters that are single assignment except for the key that has the letters Y and Z which is a double assignment key shared by these two letters. The keys assigned to letters of each grouping have at least a portion that is located some further distance in the radial direction 26 than the previous key in that grouping. The only exception to this is the double assignment key for Y and Z in the sixth grouping 24 and the single assignment key for the letter X in the sixth grouping 24 that are all located at the same radial distance 26 from the concentric 12.

The keys in addition to letters are associated with various numbers and symbols. A convert key 76 can be actuated to cause the striking of the keys to produce letters and numbers as indicated. A light 128 is located radially between portions of the first and sixth grouping 14 and 24 to indicate that the text entry device 10 is on or is receiving or sending input or output. The letters of the first grouping 14 upon extension from the concentric 12 in the radial direction 26 are A, B, C, and D and each letter is associated with an individual key. The second grouping's 16 arrangement in this regard are the letters E, F, G, and H each associated with their own respective key. The third grouping 18 is arranged so that the letter I is closest to the concentric 12 in the radial direction 26 with the letters J, K and L extending therefrom in the radial direction 26 with each having their own key associated therewith. The fourth grouping 20 has the key associated with the letter O closest to the concentric 12 and then the order of keys follows with the letters M, N and then P in the radial direction 26 with each key having its own letter. The fifth grouping 22 extends from the concentric 12 so that the order of keys is the letter U, Q, R and then S with each key having its own letter associated therewith. The sixth grouping 24 is set up so that the key associated with the letter T is closest to the concentric 12. Next, the key associated with the letter V is positioned adjacent the T in the radial direction 26, and then the key associated with the letter W is positioned in the radial direction 26 from the Y. A key associated with the letter X is next positioned in the radial direction 26 and has only the letter X associated therewith. The last key of the sixth grouping 24 has both the letters Y and Z associated therewith and is at the same radial distance from the concentric 12 in the radial direction 26 as the key associated with the letter X.

Color may be used to distinguish the groupings from one another. Boundaries that surround the keys of the various groupings are illustrated in FIG. 39. Some or all of the space in these boundaries, along with the keys themselves, may be provided with the colors to form this distinguishing feature. The space is the top surface of the keyboard of the text entry device 10 from which the keys extend. With respect to the first grouping 14, the keys of the first grouping 14 along with the space within the lines that bound the first grouping may be blue. The respective keys and bound spaces of the other groupings may be colored to further distinguish them from one another. The second grouping 16 may be green, the third grouping 18 yellow, the fourth grouping 20 orange, the fifth grouping 22 red, and the sixth grouping 24 may be violet. The keys associated with the letters A, E, I, O, U and T may all be located the same distance from and be adjacent to the concentric 12. The groupings may be arranged so that they are concave in shape as previously discussed. In this regard, the concentric 12 is generally at the lowest vertical point of the keys and the outer keys in the radial direction 26 of the groupings are generally at the highest vertical point.

Figure 40:
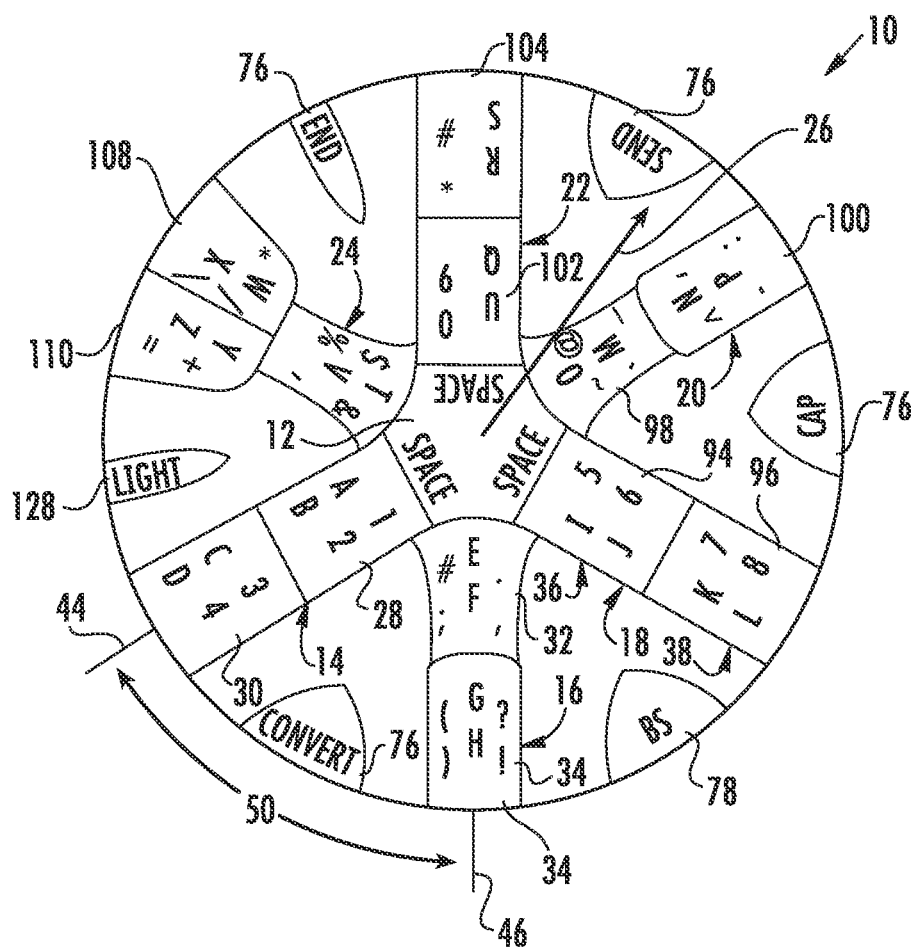
FIG. 40 is a top view of a text entry device with groupings that extend generally in a linear direction radially from the concentric.

Another exemplary embodiment of the text entry device 10 is shown with reference to FIG. 40 in which the groupings are arranged so as to extend from the concentric 12 in the radial direction 26. The groupings 14, 16, 18, 20 and 22 all have two keys associated with four letters so that each key is associated with two letters. The sixth grouping 24 has six letters with three keys such that two letters are associated with each one of the three keys. The first grouping 14 has key 28 associated with the letters A and B that is closer to the concentric 12 in the radial direction 26 than key 30 associated with the letters C and D. The keys 28 and 30 are arranged in a linear manner in the radial direction 26 and may be blue to distinguish them from the other keys of the text entry device. The second grouping 16 has key 32 associated with letters E and F that is closer to the concentric than key 34 that is associated with the letters G and H. The keys 32 and 34 are arranged in a linear manner in the radial direction 26 and are colored green to distinguish them from other portions of the text entry device 10.

The third grouping 18 has key 94 associated with the letters I and J that is closer to the concentric 12 in the radial direction 26 than key 96 that is associated with the letters K and L. The keys 94 and 96 extend linearly in the radial direction 26 and are yellow. The fourth grouping 20 has key 98 associated with the letters O and M that is adjacent the concentric 12. Key 100 is included in the fourth grouping 20 and is associated with the letters N and P and extends from the key 98 in the linear, radial direction 26. The keys 98 and 100 are orange. The fifth grouping 22 has key 102 that is adjacent the concentric 12 and is associated with the letters U and Q. Key 104 extends linearly from key 102 so that the fifth grouping 22 extends in the linear, radial direction 26. Key 104 is associated with the letters R and S and the keys 102 and 104 are both red.

The sixth grouping 24 has key 106 that is located adjacent the concentric and is associated with the letters T and V. Keys 28, 32, 94, 98, 102 and 106 are all located adjacent the concentric 12 and are all the same distance from the concentric 12 in the radial direction 26. The sixth grouping 24 has key 108 that has letters W and X associated therewith. Key 110 is also part of the sixth grouping and has letters Y and Z associated therewith. Keys 108 and 110 are located the same radial distance from the concentric 12 in the radial direction 26 and are each offset slightly from key 106 in the angular direction to have portions with different angular positions than that of key 106. Keys 106, 108 and 110 are colored violet.

All of the keys of the various groupings 14, 16, 18, 20, 22 and 24 have unique positions in the angular direction so that none of them have the exact same position in the angular direction. In some circumstances, no portions of keys of one grouping share the same angular position as any portion of any of the keys of the other groupings. The groupings are arranged so that they include letters that progress in the alphabet in a counter clockwise direction around the concentric 12. In this regard, the letters of grouping 16 are progressed in the alphabet from the letters of grouping 14, and the letters of grouping 18 are progressed in the alphabet from the letters of grouping 16. The only exception to this is that the letter T is in the sixth grouping 24 and thus out of place. In other arrangements the groupings include letters that progress in the alphabet upon the grouping progressing in the clockwise direction about the concentric 12. In yet other arrangements, the progression of letters of the alphabet with respect to the groupings is not present.

The text entry device may also include various function keys 76, a backspace key 78, and a light 128 that are located at the outer perimeter of and between various ones of the groupings. The concentric 12 may include a space key in some arrangements. Numbers and symbols may be associated with various keys and can be entered when an appropriate conversion or function key 76 is struck. The groupings may be located evenly along the surface of the keypad in the vertical direction, or the groupings may be concave in shape so that the concentric 12 is at the low point and so that the keys at the outer perimeter in the radial direction 26 are at the high point.

Figure 41:
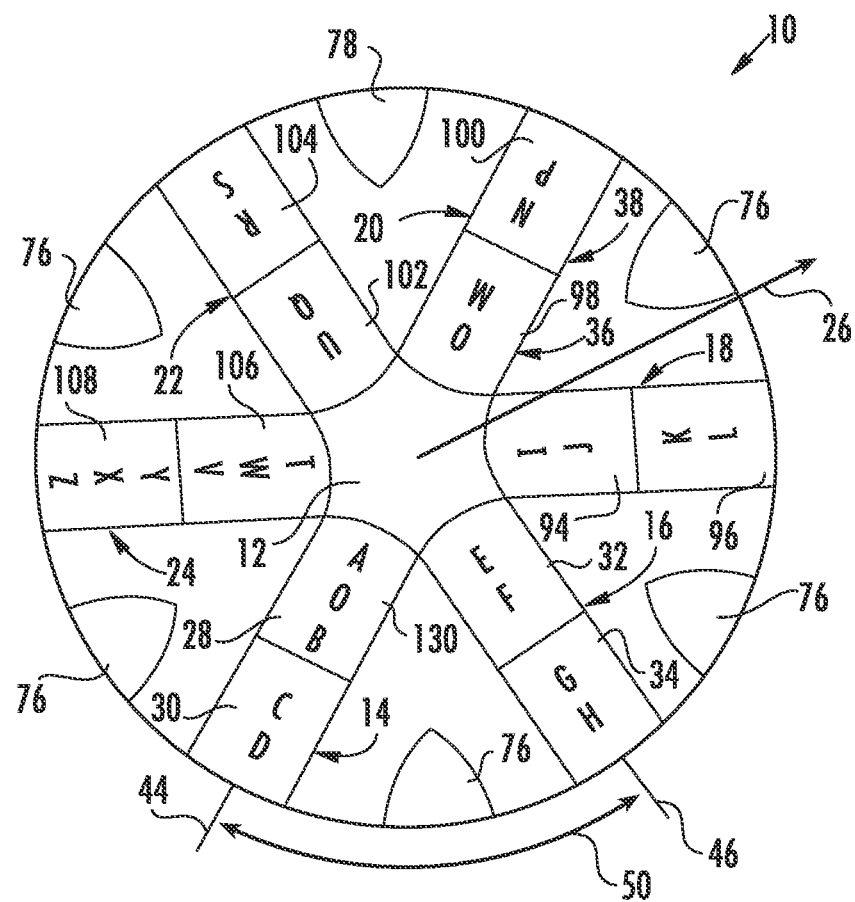
FIG. 41 is a top plan view of a text entry device similar to that of FIG. 40 but with a sixth grouping that has only two keys.

The version of the text entry device 10 shown in FIG. 41 is similar to that of FIG. 40 and a repeat of the same information is not needed. However, the version in FIG. 41 includes a sixth grouping 24 that has two keys 106 and 108 instead of three keys. Key 106 is adjacent the concentric 12 and letters T, W and V are assigned to the key 106. Key 108 is also a multi-assignment key and incorporates the letters Y, X and Z. As such, all of the groupings of the text entry device 10 have two keys and are all multi-assignment keys with no key having an individual letter associated therewith.

The multi-assignment keys can function so that the letter that is closer to the concentric 12 is the one that is actuated upon the first tapping of the key, and so that the letter that is farther from the concentric 12 of the key is actuation upon a second tapping of the key. For instance, with respect to key 28 the A letter is located closer to the concentric 12 than the B letter. A single tap of key 28 will cause the A key to be input, while a double tap of the key 28 will cycle from the A to the B to cause the B to be input. If the user hits the key 28 once and waits a determined amount of time, or if the user hits the key 28 once and then hits a different key, the A key will be selected.

The additional multi-assignment keys can be configured in a similar manner. For instance, with reference to key 106 the T letter is closest to the concentric 12 and a single tap will cause the T key to actuate. The W letter is the second closest letter of key 106 to the concentric 12 and a double strike of key 106 causes the T key to be selected. The V key is the third closest letter to the concentric 12 of key 106 and three taps of key 106 will cause the V key to be selected. The key 108 can be arranged in similar manner in which the closest letter Y is selected upon one tap, the second closest letter X is selected upon the second tap, and the third closest letter Z is selected when key 108 is hit three times.

The text entry device 10 of FIG. 41 also has a tactile member 130 located on key 28. The tactile member 130 resembles an "0" that is between the A and the B on key 28. The tactile member 130 is a raised projection from the upper surface of the key 28 and is generally higher than the upper surface of other ones of the keys. The tactile member 130 may be used as a guide by the user to orient the text entry device 10 in his or her hand. Although a single tactile member 130 is shown, it is to be understood that multiple tactile members 130 may be present in other exemplary embodiments for use in properly orienting the text entry device by touch in the hand of the user.

Figure 42:
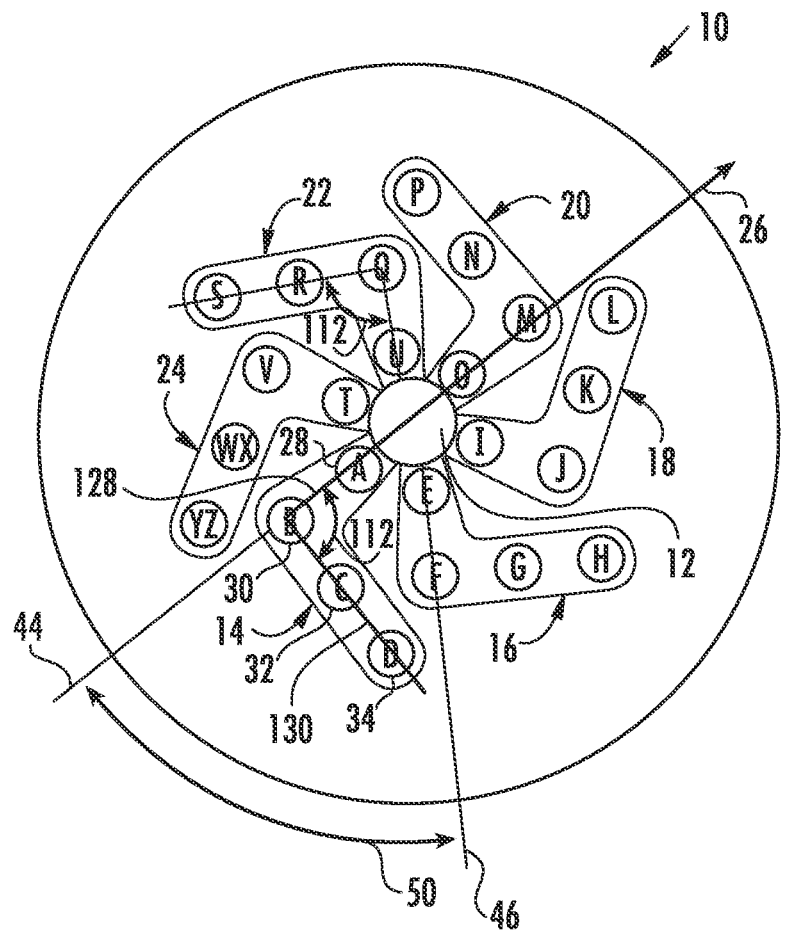
FIG. 42 is a top plan view of a text entry device with groupings that have keys arranged in a 90° angle to one another.

The exemplary embodiment in FIG. 42 includes groupings 14, 16, 18, 20, 22 and 24 that have a 90° angle associated therewith. In this regard, the first grouping 14 includes four keys 28, 30, 32 and 34 that are individually associated with the letters A, B, C and D. Key 28 is closest to the concentric 12 in the radial direction 26 and key 30 is the second closest and is adjacent key 28. A line 128 extends through the center of keys 30 and 28 and through the center of the concentric 12. Keys 32 and 34 are arranged with respect to key 30 so that a line 130 extends through the centers of keys 34, 32 and 30. Lines 128 and 130 are oriented at an angle 112 that is 90° to one another. All of the keys of the remaining groupings may be oriented in such a manner that they form 90° angles to one another as illustrated. The keys of the groupings and the boundary of the keypad surface that surrounds the keys of the groupings as shown may be made of various colors to further distinguish them from one another. Although the keys of the groupings are arranged in an angled configuration, this is but one possibility. In other arrangements, the keys of the groupings may be straight, curved, wavy, or irregular in arrangement.

Figure 43:
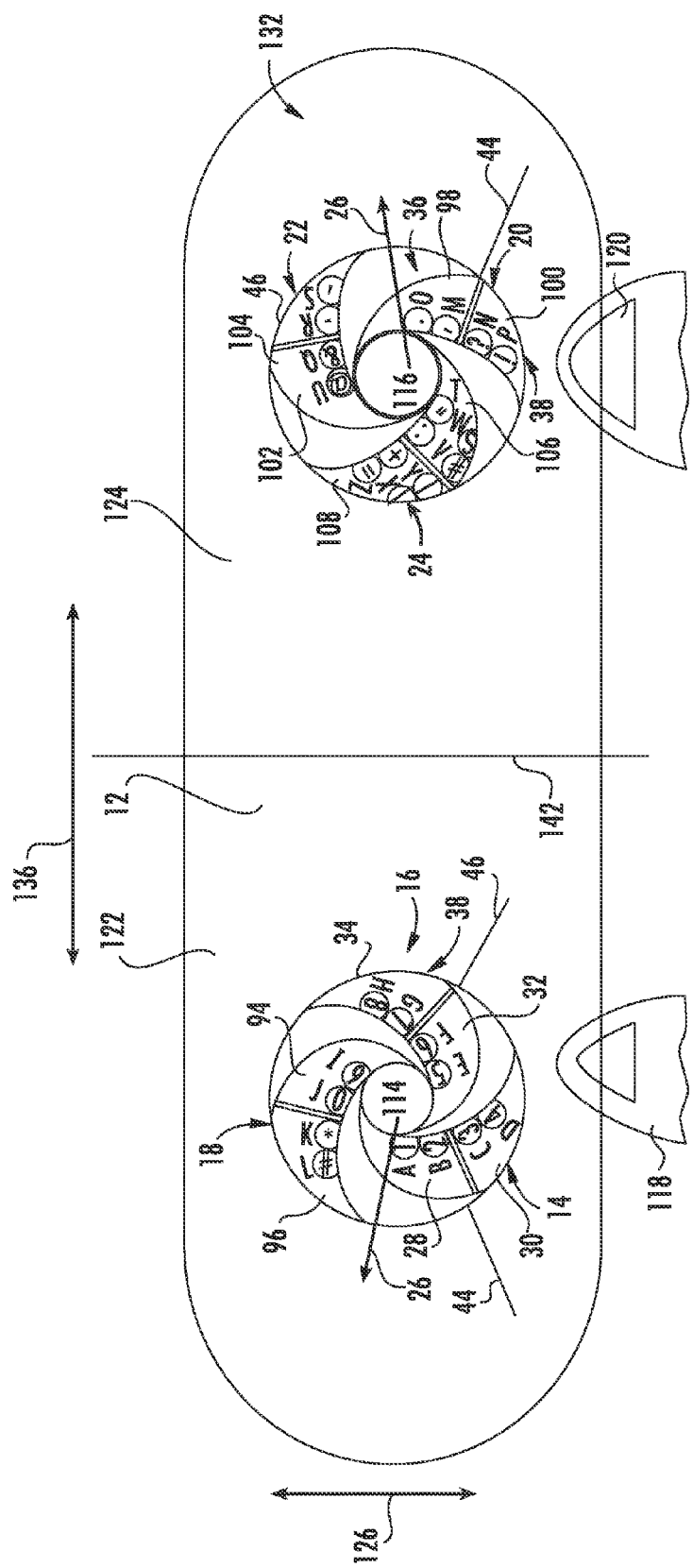
FIG. 43 is a top plan view of a two thumb text entry device in accordance with one exemplary embodiment.

Another exemplary embodiment of the text entry device 10 is shown in FIG. 43 that is designed for actuation by two thumbs 118 and 120 of the user. A vertical boundary line 142 extends through the concentric 12 in the up/down direction 126. The up/down direction 126 is the vertical direction the user sees when holding the text entry device 10 in front of him or her vertically during use. The up/down direction is the direction closer to and farther away from the body of the user when the user holds the text entry device 10 horizontally in front of him or her during use. The left/right direction 136 is the left and right direction (lateral direction) of the user when the user holds the text entry device 10 during normal use. Some of the groupings are located on the left side 122 of the boundary line 142 through the concentric 12 and the rest of the groupings are located on the opposite right side 124. The groupings on the left side 122 extend from a first secondary concentric 114. In this regard, the groupings 14, 16 and 18 extend in the radial direction 26 from the first secondary concentric 114. The groupings on the right side 124 do not extend from the first secondary concentric 114. The groupings 14, 16 and 18 each include two keys and each one of the two keys include two letters. Numbers and symbols may also be associated with the keys of the groupings 14, 16 and 18. The groupings 14, 16 and 18 are arranged about the first secondary concentric 114 in a spiral configuration. Keys 28, 32 and 94 are located immediately adjacent the first secondary concentric 114 in a first row 36, and keys 30, 38 and 96 are oriented in a second row 38 at the outer perimeter of the groupings 14, 16 and 18. The user will use his or her left thumb 118 to actuate the keys 28, 32, 94, 30, 38 and 96.

The text entry device 10 also includes groupings 20, 22 and 24 that are located on the right side 124 of the boundary line 142 and extend from the second secondary concentric 116. None of the keys of the groupings 20, 22 and 24 extend from the first secondary concentric 114. The groupings 20, 22 and 24 include keys 98, 102 and 106 that are located in a first row 36 immediately adjacent the second secondary concentric 116. Keys 100, 104 and 108 are located farther from the second secondary concentric 116 in the radial direction 26 than the other keys 98, 102 and 106 in their respective groupings 20, 22 and 24. Keys 98, 100, 102 and 104 are double assignment keys and include two letters, and keys 106 and 108 are triple assignment keys and include three letters therewith. Symbols may also be included with the keys on the right side 124 and numbers may not be associated with the keys on the right side 124.

The right thumb 120 of the user is used to actuate the keys 98, 100, 102, 104, 106 and 108. As with the other keys of the text entry device 10 the keys may be physical keys capable of being contacted by the user. The groupings 20, 22 and 24 can be arranged in a spiral configuration about the second secondary concentric 116. The first and second secondary concentrics 114 and 116 may be separated from one another some distance in the left/right direction 136. Various keys such as a space key, function keys 76, or a backspace key 78 may be located at the concentric 12 or may be located some distance in the radial direction 26 from the first secondary concentric 114, or may be located some distance in the radial direction 26 from the second secondary concentric 116. It is to be understood that all of the keys of the text entry device 10 are located on the front surface 132 of a base of the device 10 and are not located on two separate devices. The boundary line 142 may not be an actual physical marker on the device 10 but may simply be a reference point for purposes of description of the device 10.

The keys of the groupings 14, 16 and 18 may have portions of keys that share the same angular position as one another about the first secondary concentric 114. For instance, a portion of key 32 may have the same angular position about the first secondary concentric 114 as a portion of the key 30. The entire key 32 need not have the same angular position as the entire key 30, but only portions of these keys 32 and 30 may have the same angular position. This may be due to the spiral configurations of the groupings 14, 16 and 18 about the first secondary concentric 114. In other arrangements, the groupings 14, 16 and 18 may be arranged so that no portion of keys of one of the groupings 14, 16 and 18 share the same angular position as any portion of keys of the other groupings 14, 16 and 18. The keys of groupings 20, 22 and 24 about the second secondary concentric 116 may be arranged in a similar manner as those previously described with respect to the groupings surrounding the first secondary concentric 114.

A backspace key 78 may be located at the first secondary concentric 114, and a space key may be located at the second secondary concentric 116. The keys 28 and 30 may be blue, and keys 32 and 34 may be green. Keys 94 and 96 may be yellow, and keys 98 and 100 may be orange. Further, keys 102 and 104 may be red, and keys 106 and 108 may be violet so that the various groupings of the text entry device 10 can be distinguished from one another. Although shown as being in a spiral configuration about the first and second secondary concentrics 114 and 116, the keys of the various groupings can be arranged in a linear format so that a portion of a key of one grouping does not overlap a portion of a key of another grouping about the secondary concentric 114 or 116. In this regard, all of the groupings may have two keys that are double assignment keys with the exception of the sixth grouping 24 that has two triple assignment keys.

Figures 44, 45:
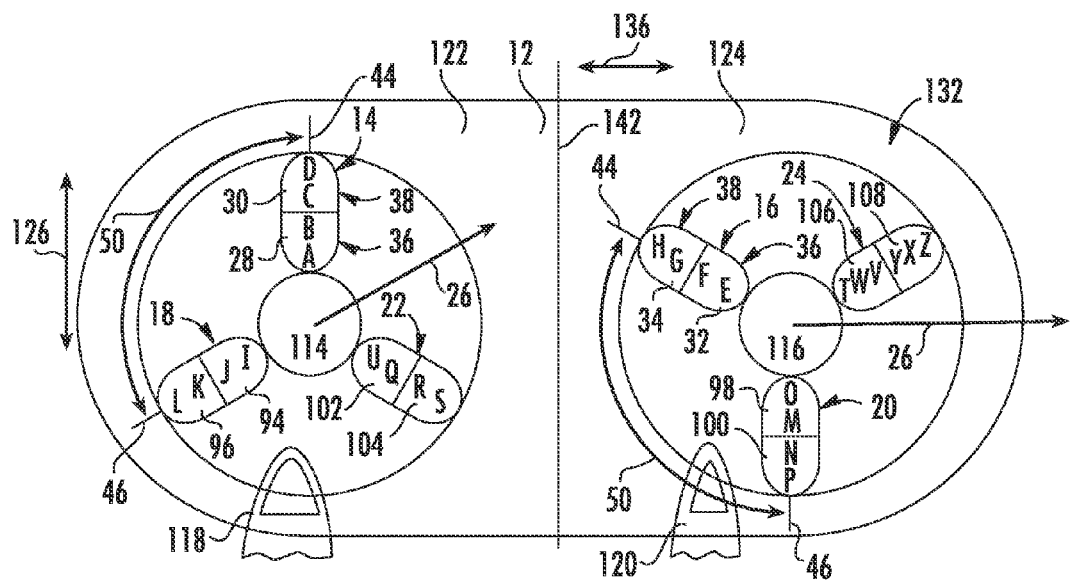
FIG. 44 is a top plan view of a two thumb text entry device in accordance with yet another exemplary embodiment.
FIG. 45 is a top plan view of a two thumb text entry device in accordance with yet another exemplary embodiment.

Another exemplary embodiment of the text entry device 10 is disclosed in FIG. 44 that includes features similar to those disclosed with respect to the device 10 of FIG. 43 and a repeat of this information is not necessary. One difference lies in the fact that the first grouping 14, third grouping 18, and fifth grouping 22 extend from the first secondary concentric 114, while the second grouping 16, fourth grouping 20, and sixth grouping 24 extend from the second secondary concentric 116. In this regard, the groupings 14, 18 and 22 are on the left side 122, while the groupings 16, 20 and 24 are on the right side 124 of the boundary line 142 of the concentric 12. Also, the groupings are not arranged in a spiral configuration about the secondary concentrics 114 and 116 but instead the keys of the groupings extend in a linear direction from the concentrics 114 and 116 in the radial direction 26. None of the portions of the keys of the groupings 14, 18 and 22 share the same angular position with portions of keys of the other groupings 14, 18 and 22. In this regard, the angular position of the keys of the first grouping 14 are unique from the angular positions of the keys of the third and fifth groupings 18 and 22. The keys of the groupings 16, 20 and 24 that surround the second secondary concentric 116 likewise do not have any portions that share the same angular position as other portions of keys of the groupings 16, 20 and 24. For example, the angular position 44 of all of the portions of the keys of the second grouping 16 are completely unique about the second secondary concentric 116 from the angular position 46 of all of the portions of the keys of the fourth grouping 20 and the angular position of all of the keys of the sixth grouping 24.

Although shown as being linearly arranged about the first and second secondary concentrics 114 and 116, the keys of the various groupings can be angled in arrangement, spiral in arrangement, or irregular in arrangement upon extension from the concentrics 114 and 116 in other embodiments.

Another arrangement of the text entry device 10 is shown in FIG. 45 that includes features similar to those of FIG. 44 and a repeat of this information is not necessary. However, differences in FIG. 45 include groupings 14, 16 and 18 that are on the left side 122 and extend radially from the first secondary concentric 114, and groupings 20, 22 and 24 that are on the right side 124 and extend radially from the second secondary concentric 116. The first five groupings all include four letters with two keys so that all of the keys of these groupings are double assignment keys. However, the sixth grouping 24 includes three keys instead of two. The key closest to the concentric 116 includes the letters T and V. The other two keys are offset from the first key so that they assume different positions in the angular direction about the second secondary concentric 116. The two keys with the letters W and X and the letters Y and Z are each located the same distance in the radial direction 26.

Figure 46:
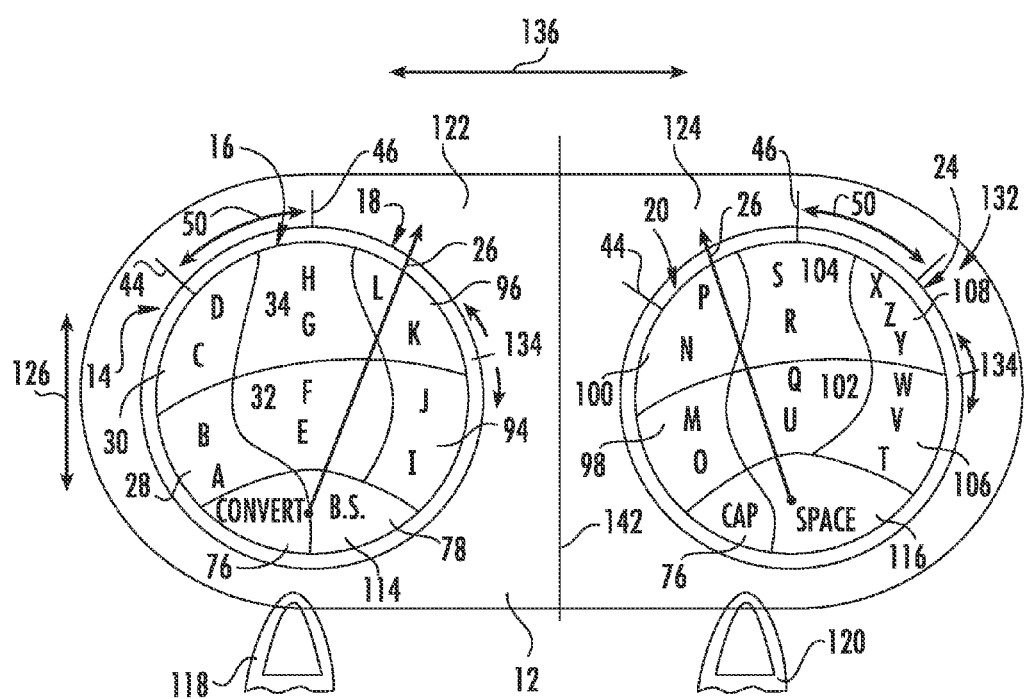
FIG. 46 is a top plan view of a two thumb text entry device in accordance with yet another exemplary embodiment.

Another two thumb embodiment of the text entry device 10 is disclosed in FIG. 46 in which the groupings 14, 16 and 18 are on the left side 122 and extend in the radial direction 26 from the first secondary concentric 114. The groupings 14, 16 and 18 do not completely surround the first secondary concentric 114 but instead surround roughly one side of the first secondary concentric 114. The keys 28, 30, 32, 34, 94 and 96 are all double assignment keys. A convert key 76 and a back space key 78 are located at the first secondary concentric 114 and can be of a color or colors different than those of the groupings. The keys of the groupings 14, 16 and 18 and those of the first secondary concentric 114 can be rotated relative to the front surface 132 of the base of the device 10 by way of a rotatable member 134. Rotation of these keys about the front surface 132 allows them to be positioned to suit the comfort of the user or allow for better striking by the left thumb 118 of the user.

The groupings 20, 22 and 24 are located on the right side 124 and extend from the second secondary concentric 116 in the radial direction 26 from approximately half of the side of the second secondary concentric 116 and do not completely surround the second secondary concentric 116. A space key and a cap locks key are located at the second secondary concentric 116 and these keys, along with those of groupings 20, 22 and 24 may be rotates about the front surface 134 via a separate rotatable member 134. This rotation allows for the keys on the right side 124 to be rotated to a desired orientation to suit the comfort of striking by the right thumb 120. Although shown and described with reference to the embodiment of FIG. 46, the groupings can be rotated or adjustable with respect to the front surface 132 in various exemplary embodiments of the text entry device 10 described herein.

Figure 47:
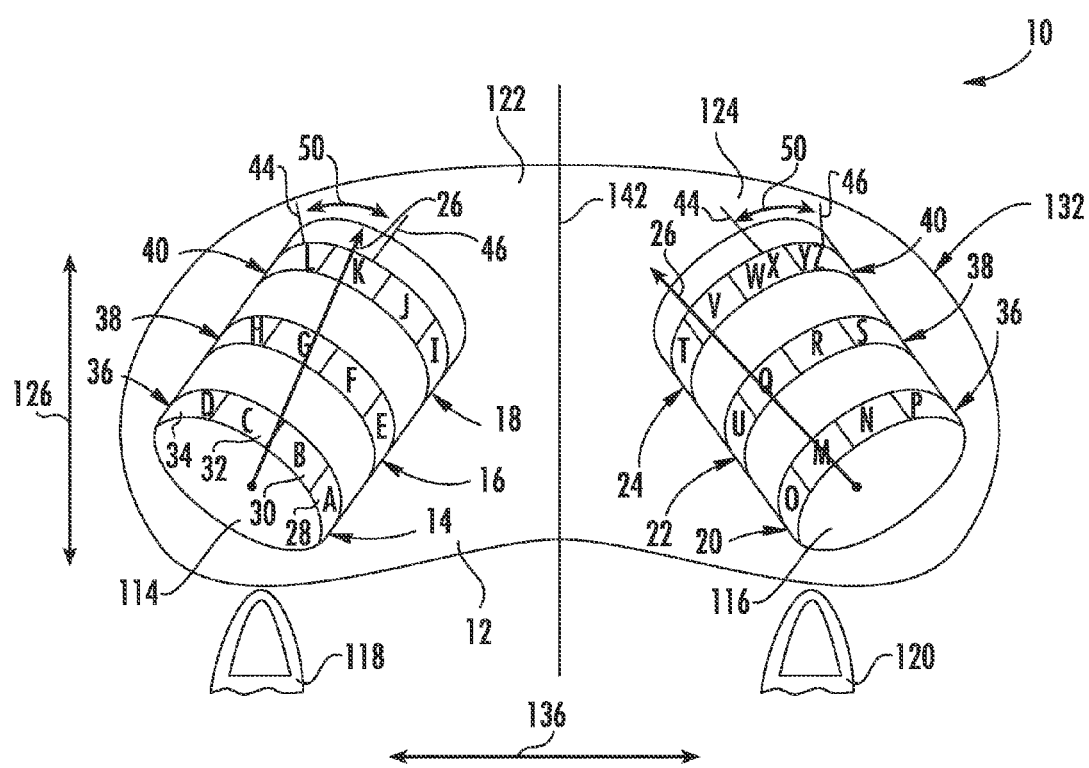
FIG. 47 is a top plan view of a two thumb text entry device with groupings that extend radially from first and second secondary concentrics that are arranged in rows extending from the concentrics.

FIG. 47 discloses another arrangement of a two thumb text entry device 10 in which the groupings 14, 16 and 18 are on the left side 122 and extend from the first secondary concentric 114. The groupings are arranged so that the first grouping 14 is closer to the first secondary concentric 114 than the second and third groupings 16 and 18, and so that the third grouping 18 is farthest from the first secondary concentric 114 in the radial direction 26 than the other groupings 14 and 16. The groupings 14, 16 and 18 are angled in the left/right direction 136 so that portions of the keys of the third grouping 18 are closer to the boundary line 142 than portions of the keys of the second grouping 16 and portions of the keys of the first grouping 14. Portions of keys of the groupings 14, 16 and 18 share the same angular position as one another. For example, portions of keys associated with the letters C, G and L may all have a first angular position 44.

The groupings 20, 22 and 24 on the right side 124 extend from the second secondary concentric 116 but do not completely surround the second secondary concentric 116. The fourth grouping 20 is closest to the second secondary concentric 116 in the radial direction 26, and the sixth grouping 24 is farthest. All of the keys of groupings 20, 22 and 24 are single assignment keys with the exception of two of the keys of the sixth grouping 24 that have the W and X letters and the Y and Z letters that are double assignment keys. The groupings 20, 22 and 24 are arranged so that portions of the keys of the sixth grouping 24 are closest to the boundary line 142 in the left/right direction 136 and so that portions of the keys of the fourth grouping 20 are farthest from the boundary line 142 in the left/right direction 136. The angled arrangement of the groupings 20, 22 and 24 may be comfortable for striking of their keys by the right thumb 120.

In other arrangements, the groupings 14, 16, 18, 20 and 22 may have two double assignment keys, and the sixth grouping 24 may have two triple assignment keys. The keys having the letters A, E and I may be farthest from the boundary line 142 in their respective rows 36, 38 and 40.

Figure 48:
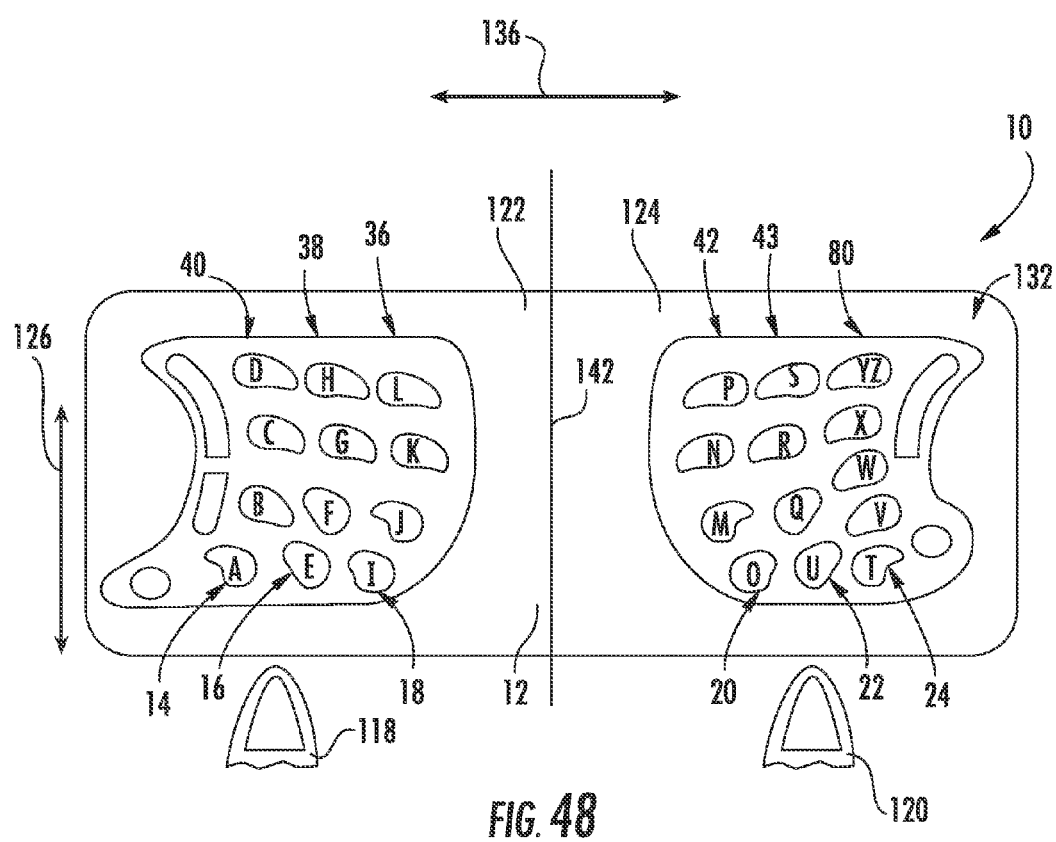
FIG. 48 is a top plan view of a two thumb text entry device in accordance with yet another exemplary embodiment.

FIG. 48 discloses an exemplary embodiment of the text entry device 10 that is a two thumb arrangement. The groupings 14, 16 and 18 are on the left side, and the groupings 20, 22 and 24 are on the right side 124. The groupings 14, 16 and 18 extend away from the concentric 12 and are arranged such that all of the keys of the third grouping 18 are in the first row 36 of keys that are closest to the concentric 12 on the left side 122. The second row 38 includes all of the keys of the second grouping 16 which are next closest to the concentric with respect to the keys on the left side 122. The third row 40 includes all of the keys of the first grouping 14 that are farthest from the concentric 12 in the left/right direction 136 on the left side 122.

The keys of the fourth grouping 20 are all located in the fourth row 42 that is the row that is closest to the concentric 12 on the right side 124. The fifth grouping 22 has all of its keys in the fifth row 43 which is the next closest to the concentric 12 on the right side 124. The keys of the sixth grouping 24 are farthest from the concentric 12 in the right/left direction 136 on the right side 124 and are all located in the sixth row 80.

The letters A, E, I, O, U, and T are all located at the lowest point in their respective groupings in the up/down direction 126 of the text entry device 10. Various function keys 76, back space key 78, and light 128 may be located at the concentric 12 or may be beyond the third row 40 on the left side 122 and beyond the sixth row 80 on the right side 124 in the left/right direction 136.

In another embodiment of the text entry device, instead of all single assignment keys and one double assignment key for Y and Z, all of the keys of the groupings are double assignment keys. Groupings 14, 16, 18, 20, and 22 have two keys that are both double assignment keys, and the sixth grouping 24 has three double assignment keys. In a yet additional exemplary embodiment, the keys may be all double assignment keys with two keys in each grouping with the exception of the sixth grouping 24 that has three double assignment keys. The groupings can be linear in arrangement and angled towards the boundary line. In this regard, the rows 36, 38, 40, 42, 43 and 80 extend closer to the boundary line 142 upon extension from the bottom to the top in the up/down direction 126.

In a yet additional exemplary embodiment, the rows 36, 38, 40, 42, 43 and 80 may extend closer to the boundary line 142 upon extension from the bottom to the top in the up/down direction 126, but the first grouping 14 is the lowest of the groupings in the up/down direction 126 on the left side 122. The third grouping 18 is the highest grouping on the left side 122 in the up/down direction 126 and the second grouping 16 is between the first and third groupings 14 and 18. On the right side 124, the fourth grouping 20 is the lowest and the sixth grouping 24 the highest in the up/down direction 126 with the fifth grouping 22 between them in the up/down direction 126. In this embodiment, all of the keys are double assignment keys with the sixth grouping 24 instead having two triple assignment keys.

In a yet further exemplary embodiment all of the keys are double assignment with exception of the sixth grouping 24 that has two triple assignment keys. The first grouping 14 is highest in the up/down direction 126 and the third grouping 18 lowest in the up/down direction 126 with the second grouping 16 in between on the left side 122. The keys with the letters A, E and I are farthest from the boundary line 142 in the left/right direction 136 in their respective groupings. On the right side 124, the sixth grouping 24 is highest and the fourth grouping 20 lowest with the fifth grouping 22 in between in the up/down direction 126. The keys associated with the letters O, U and T are farthest from the boundary line 142 in the left/right direction 136 in their respective groupings. In yet another embodiment, the text entry device 10 is as immediately discussed with the exception that the sixth grouping 24 has three double assignment keys.

Figure 49:
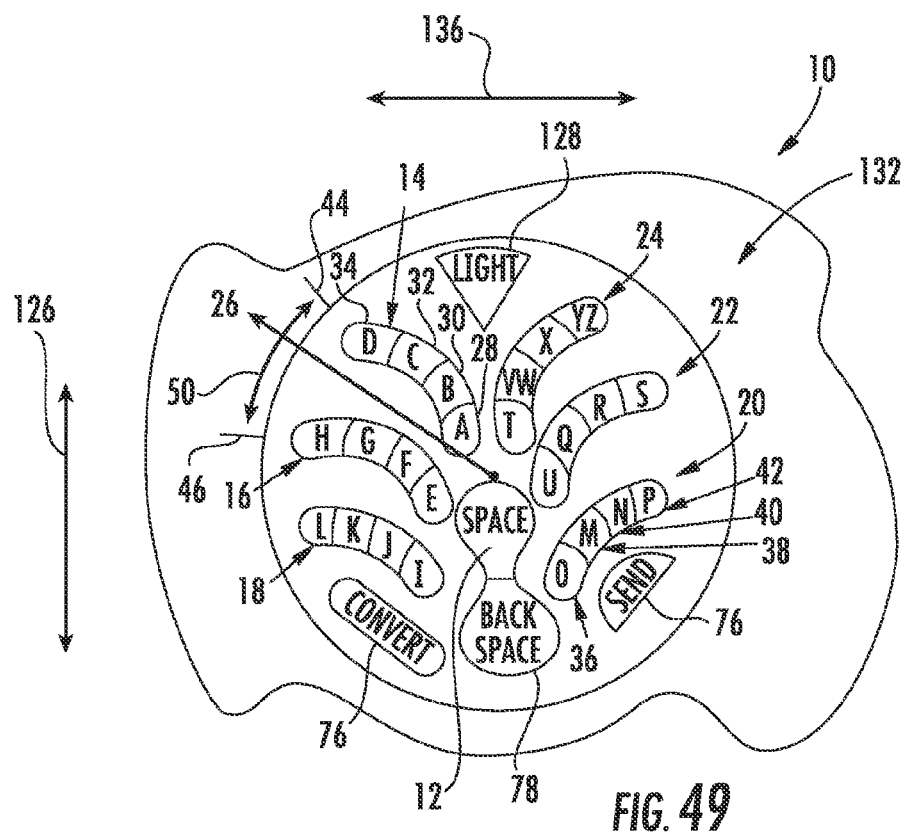
FIG. 49 is a top plan view of a text entry device with groupings that extend from the concentric in curved shapes.

Another exemplary embodiment is shown with reference to FIG. 49 in which groupings 14, 16, 18, 20, 22 and 24 extend from the concentric 12. It is to be understood that as used herein, the term concentric need not be the center of the keypad but may simply be a starting point from which the groupings extend or are arranged. This is true for the first and second secondary concentrics 114 and 116 as well. The user may use one thumb or two thumbs to actuate the keys of the groupings. The keys of the groupings 14, 16, 18, 20, 22 and 24 may extend in a curved fashion from the concentric 12. The letters I, E, A, T, U, and O may be the closest letters to the concentric 12 in the radial direction 26 of their respective groupings 14, 16, 18, 20, 22 and 24. The letters L, H, D, S and P may be associated with keys of their respective groupings that are farthest from the concentric in the radial direction 26. All of the letters may be associated with a single key except for the letters V and W that are assigned to a double assignment key, and for the letters Y and Z that are associated with a double assignment key. A space key may be located at the concentric 12, and the groupings may not completely surround but may partially surround the concentric 12. The first and second secondary groupings 114 and 116 are not present in the exemplary embodiment of FIG. 49.

The groupings can be located on the front surface 132 such that additional room on the front surface 132 is present to the left and to the right of the groupings in the left/right direction 136. The thumbs 120 and 122 may rest on this additional area of the front surface 132 to provide comfort and convenience to the user when using the text entry device 10.

Figure 50:
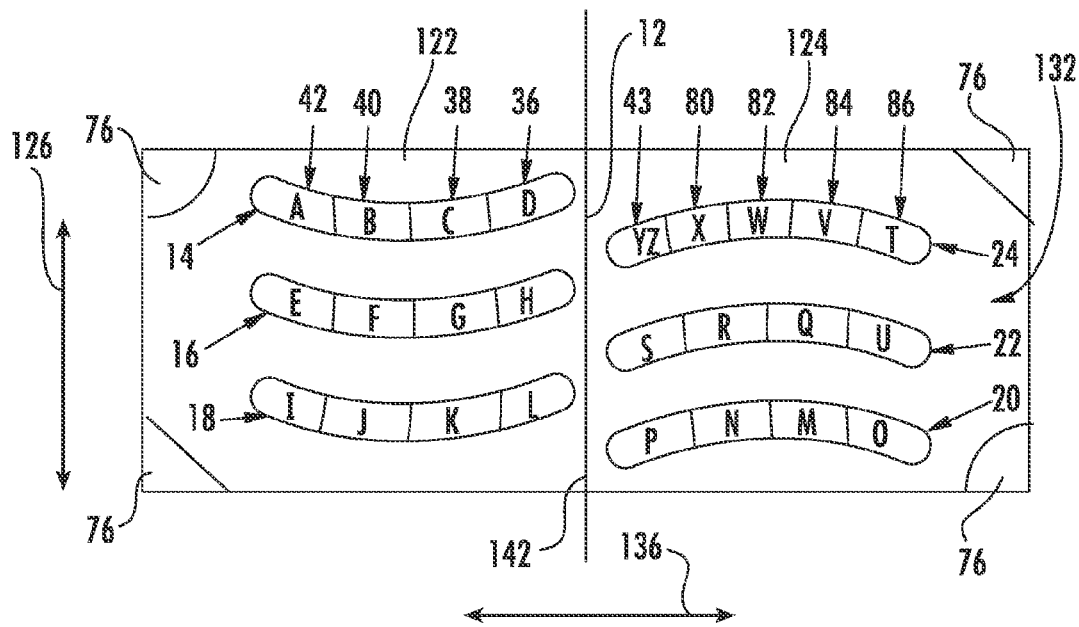
FIG. 50 is a top plan view of a text entry device with groupings on either side of the concentric that extend in wavy shapes.

FIG. 50 discloses an exemplary embodiment that may be actuated by one or two thumbs of the user. Function keys 76 can be located at the four corners of the rectangular shaped front surface 132. Groupings 14, 16 and 18 may be on the left side 122 of the boundary line 142 and can have keys arranged in a wavy pattern. The first grouping 14 may be located at the highest point in the up/down direction 126 on the left side 122, and the third grouping 18 at the lowest point with the second grouping 16 in between. The keys associated with the letters A, E and I are the farthest from the boundary line 142 in the left/right direction 136 on the left side 122, and the keys associated with the letters D, H, and L of their respective groupings are closest to the boundary line 142 on the left side 122. The keys of the groupings 14, 16 and 18 are arranged in a horizontal manner such that every key is located in a different row 36, 38, 40 and 42. In this regard, the keys of the letters D, H and L are in row 36, while the keys of letters A, E and I are in row 42.

The groupings 20, 22 and 24 are on the right side 124 and are also in a horizontal arrangement. Grouping 20 is at the bottom of the text entry device 10 on the right side 124 in the up/down direction 126 and the letter O is farthest from the boundary line 142 on the right side 124 in the left/right direction 136. The grouping 22 is above grouping 20 in the up/down direction 126 and the key associated with the letter U is farthest from the boundary line 142 and the key associated with the letter S closest to the boundary line 142 in the left/right direction 136. The sixth grouping 24 is at the highest point in the up/down direction 126 on the right side 124. A double assignment Y and Z key is closest to the boundary line 142 and a single assignment key associated with the letter T is farthest from the boundary line 142 in the left/right direction 136. Row 43 associated with letters P, S and double assignment Y and Z is the row closest to the boundary line 142 in the left/right direction 136 on the right side 124. Row 86 that includes only the key associated with the letter T is the farthest row from the boundary line 142 on the right side 124 in the left/right direction 136. The keys of the groupings 20, 22 and 24 are arranged in a wavy pattern. All of the keys may be single assignment keys with the exception of the Y and Z key that is a double assignment key. In other arrangements, all of the keys may be multiple assignment keys with respect to the letters.

It is to be understood that the arrangement or extension of the groupings from the concentric 12 in the radial direction 26 need not be circular in all cases. For example, the groupings can be arranged with respect to the concentric 12 so that they extend in a linear direction from the concentric 12. The groupings may extend so that they are parallel to one another in some embodiments. As such, the radial direction 26 may be extension in a circular direction from the concentric 12, or may be extension from the concentric 12 in a linear direction that does not completely surround the concentric 12 on all sides.

Figure 51:
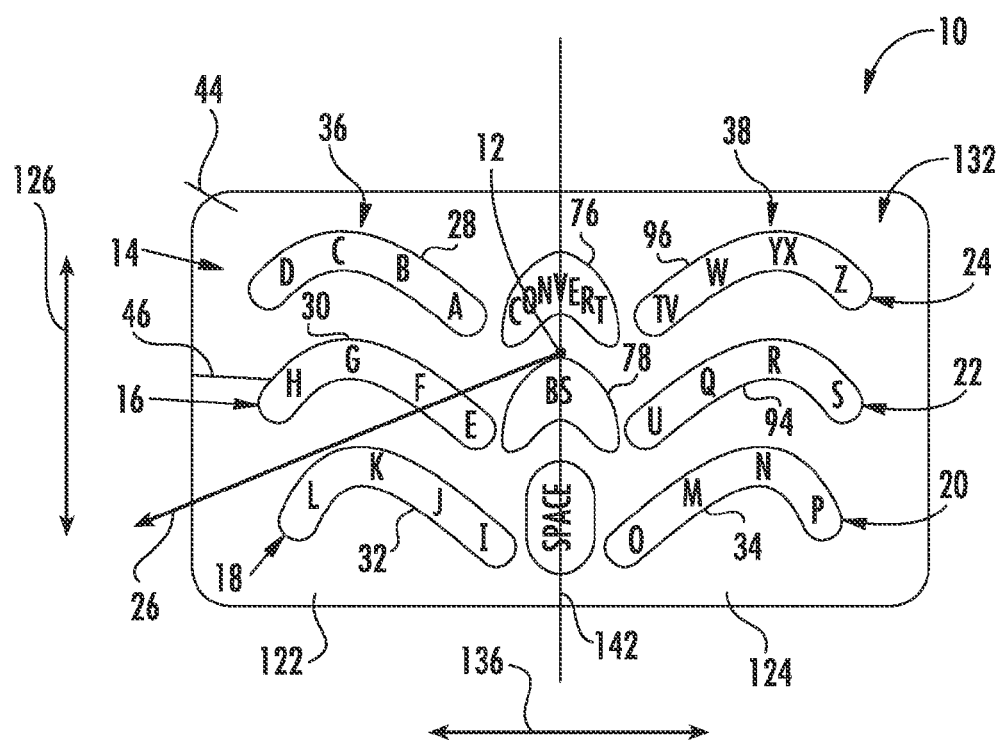
FIG. 51 is a top plan view of a text entry device with groupings that extend from the concentric in curved shapes.

Another exemplary embodiment of the text entry device 10 is shown in FIG. 51 in which the keys of the groupings extend in the radial direction 26 away from the concentric 12. The groupings are curved in arrangement and the groupings 14, 16 and 18 are on the left side 122 and the groupings 20, 22 and 24 are on the right side 124. The groupings all include but a single key that each have four letters assigned thereto except for the key of the sixth grouping 24 that has six letters assigned.

Figure 52:
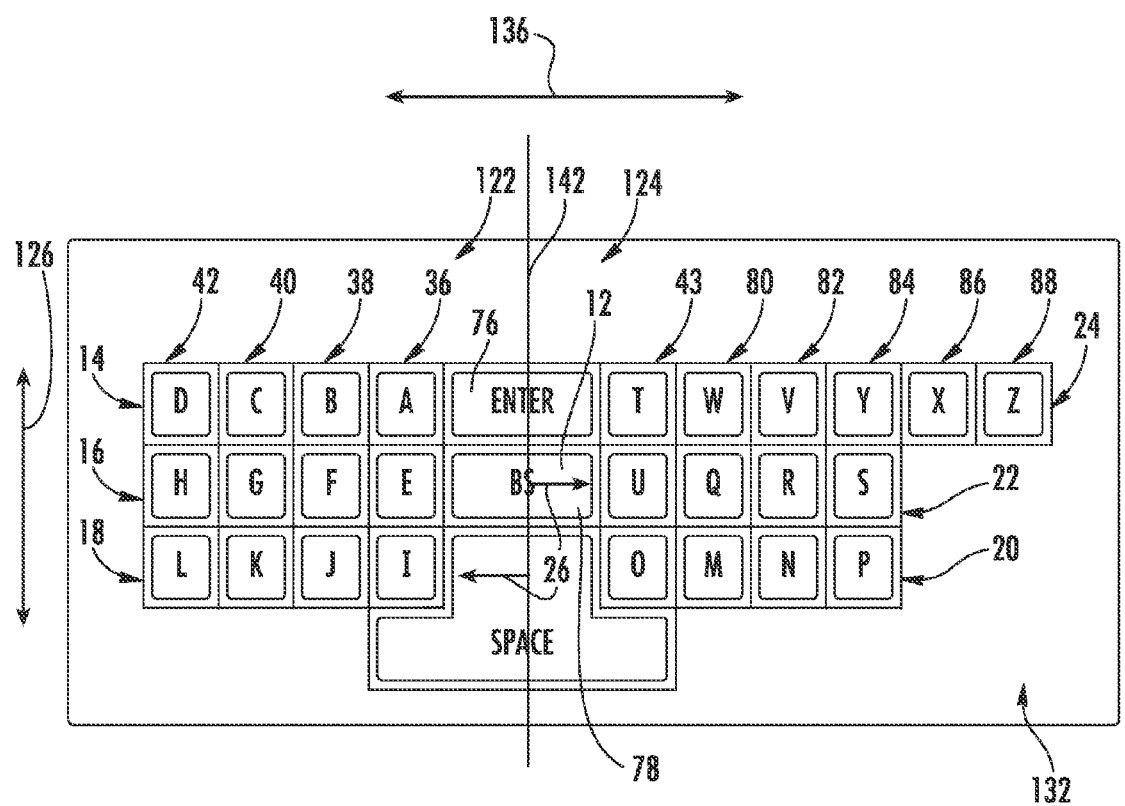
FIG. 52 is a top plan view of a text entry device in which the groupings extend linearly but not in an angular direction from the concentric.

Another exemplary embodiment of the text entry device 10 is shown with reference to FIG. 52 in which the keys of the groupings extend in a linear direction in the left/right direction 136. The layout of the keyboard is the same as that previously discussed with respect to the embodiment in FIG. 30 with a few exceptions. The arrangement of letters in the sixth grouping 24 is different in that the letter W is in row 80, the letter V is in row 82, the letter Y is in row 84, and the letter X is in row 86. The groupings 20, 22 and 24 are on the right side 124, and the groupings 14, 16 and 18 are on the left side 122. The grouping 14 is highest in the up/down direction 126 on the left side 122, and the grouping 24 is highest in the up/down direction 126 on the right side 124.

Various embodiments in which the groupings include keys arranged in a linear direction are disclosed in FIGS. 53A-53I.

Figure 53A:
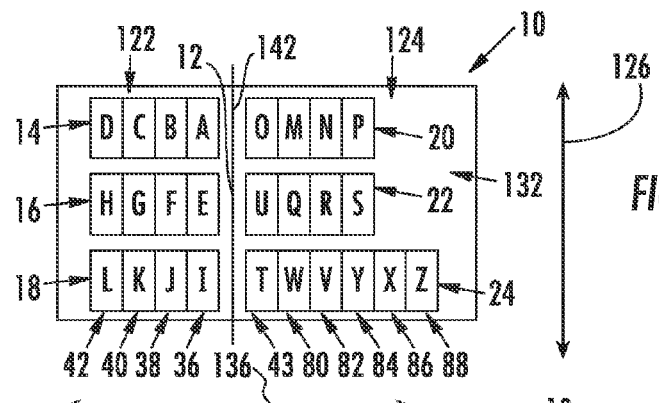
FIGS. 53A-53I are top views of various text entry devices in which the groupings extend linearly but not in an angular direction from the concentric.

In FIG. 53A the groupings include keys arranged in the left/right direction 136 and groupings 14, 16 and 18 are on the left side 122, and groupings 20, 22 and 24 are on the right side 124. The letters A, E, I, O, U and T of the various groupings are closest to the boundary line 142 in the left/right direction 136. The keys associated with letters D, H, L, P, S and Z are farthest from the boundary line 142 of their respective groupings in the left/right direction 136. Grouping 14 is highest and grouping 18 is lowest in the up/down direction 126 on the left side 122, and grouping 20 is highest and grouping 24 lowest in the up/down direction 126 on the right side 124.

Figure 53B:
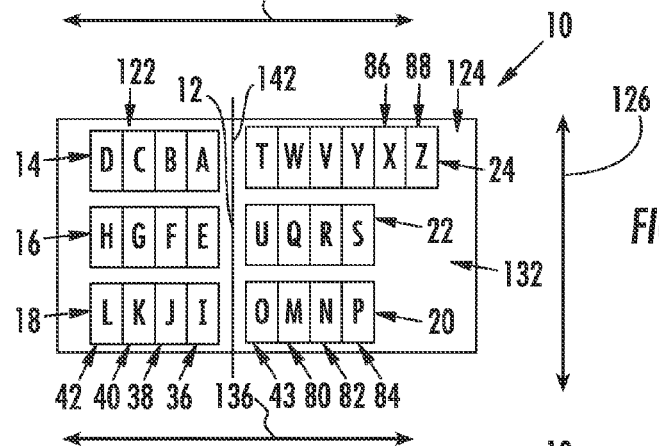

In FIG. 53B the groupings include keys arranged in the left/right direction 136 and groupings 14, 16 and 18 are on the left side 122, and groupings 20, 22 and 24 are on the right side 124. The letters A, E, I, O, U and T of the various groupings are closest to the boundary line 142 in the left/right direction 136. The keys associated with letters D, H, L, P, S and Z are farthest from the boundary line 142 of their respective groupings in the left/right direction 136. Grouping 14 is highest and grouping 18 is lowest in the up/down direction 126 on the left side 122, and grouping 24 is highest and grouping 20 lowest in the up/down direction 126 on the right side 124.

Figure 53C:
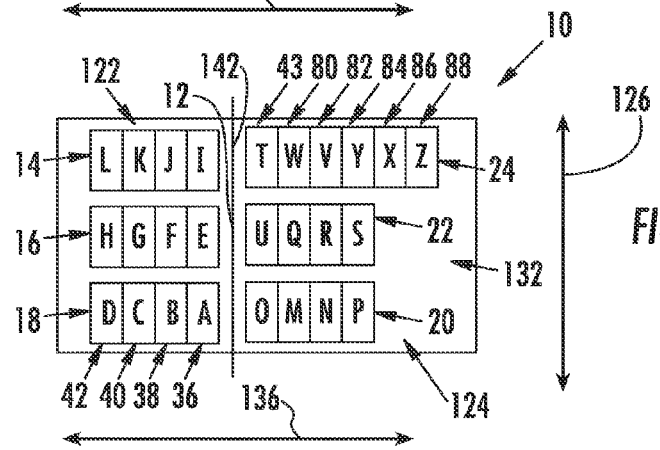

In FIG. 53C the groupings include keys arranged in the left/right direction 136 and groupings 14, 16 and 18 are on the left side 122, and groupings 20, 22 and 24 are on the right side 124. The letters A, U and T of the various groupings are closest to the boundary line 142 in the left/right direction 136. The keys associated with letters D, H, L, P, S and Z are farthest from the boundary line 142 of their respective groupings in the left/right direction 136. Grouping 18 is highest and grouping 14 is lowest in the up/down direction 126 on the left side 122, and grouping 24 is highest and grouping 20 lowest in the up/down direction 126 on the right side 124.

Figure 53D:
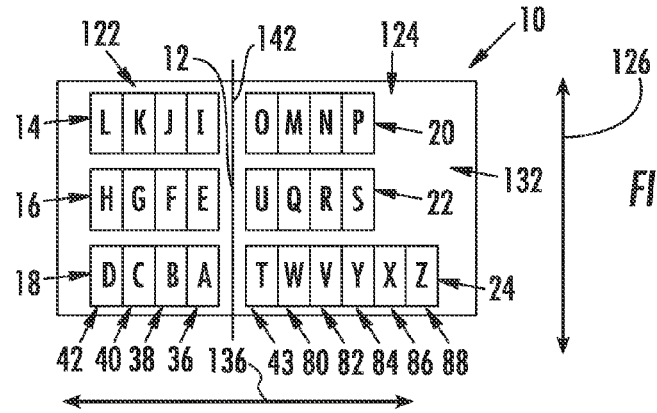

In FIG. 53D the groupings include keys arranged in the left/right direction 136 and groupings 14, 16 and 18 are on the left side 122, and groupings 20, 22 and 24 are on the right side 124. The letters A, E, I, O, U and T of the various groupings are closest to the boundary line 142 in the left/right direction 136. The keys associated with letters D, H, L, P, S and Z are farthest from the boundary line 142 of their respective groupings in the left/right direction 136. Grouping 18 is highest and grouping 14 is lowest in the up/down direction 126 on the left side 122, and grouping 20 is highest and grouping 24 lowest in the up/down direction 126 on the right side 124.

Figure 53E:
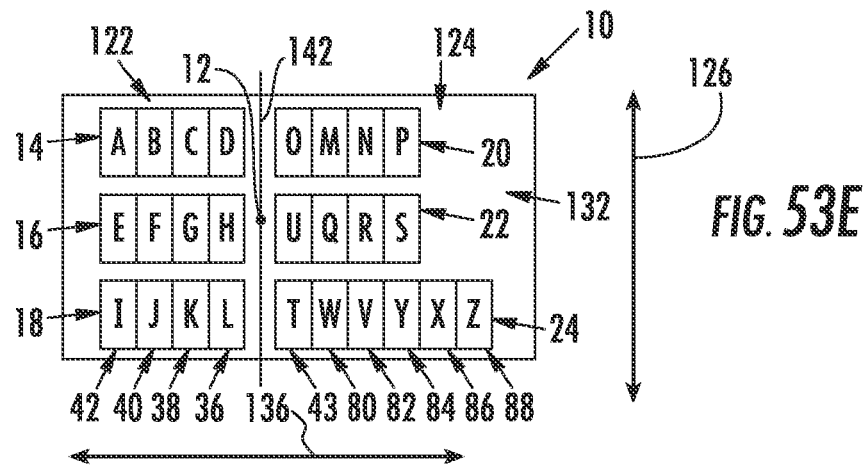

In FIG. 53E the groupings include keys arranged in the left/right direction 136 and groupings 14, 16 and 18 are on the left side 122, and groupings 20, 22 and 24 are on the right side 124. The letters D, H, L, O, U and T of the various groupings are closest to the boundary line 142 in the left/right direction 136. The keys associated with letters A, E, I, P, S and Z are farthest from the boundary line 142 of their respective groupings in the left/right direction 136. Grouping 14 is highest and grouping 18 is lowest in the up/down direction 126 on the left side 122, and grouping 20 is highest and grouping 24 lowest in the up/down direction 126 on the right side 124. Row 38 that includes the letters C, G and K is the second closest row to the boundary line 142 on the left side 122, and row 40 that includes the letters B, F and J is the third closest row to the boundary line 142 on the left side 122 in the left/right direction 136.

Figure 53F:
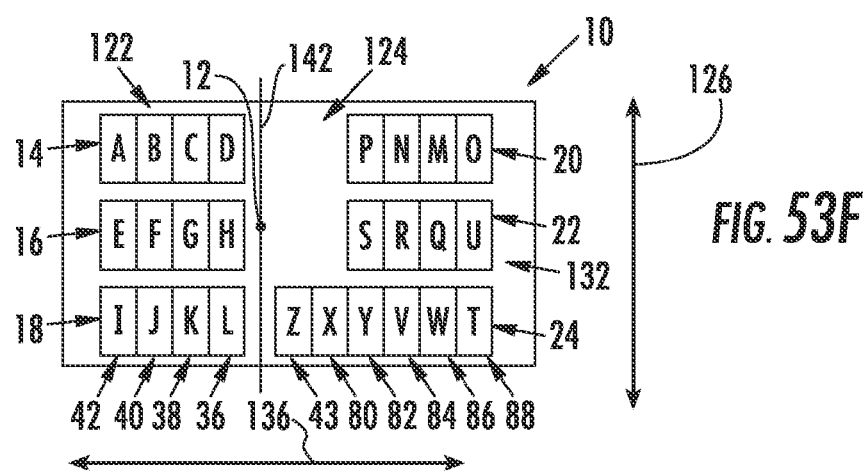

In FIG. 53F the groupings include keys arranged in the left/right direction 136 and groupings 14, 16 and 18 are on the left side 122, and groupings 20, 22 and 24 are on the right side 124. The letters D, H, L, P, S and Z of the various groupings are closest to the boundary line 142 in the left/right direction 136. The keys associated with letters A, E, I, O, U and T are farthest from the boundary line 142 of their respective groupings in the left/right direction 136. Grouping 14 is highest and grouping 18 is lowest in the up/down direction 126 on the left side 122, and grouping 20 is highest and grouping 24 lowest in the up/down direction 126 on the right side 124. Row 38 that includes the letters C, G and K is the second closest row to the boundary line 142 on the left side 122, and row 40 that includes the letters B, F and J is the third closest row to the boundary line 142 on the left side 122 in the left/right direction 136. On the right side 124, row 80 that includes the letter X is the second closest row and row 82 that includes the letters Y, S and P is the third closest row to the boundary line 142 in the left/right direction 136. Row 84 that includes letters V, R and N is the fourth closest row, and row 86 that includes letters W, Q and M is the fifth closest row to the boundary line 142 in the left/right direction 136 on the right side 124.

Figure 53G:
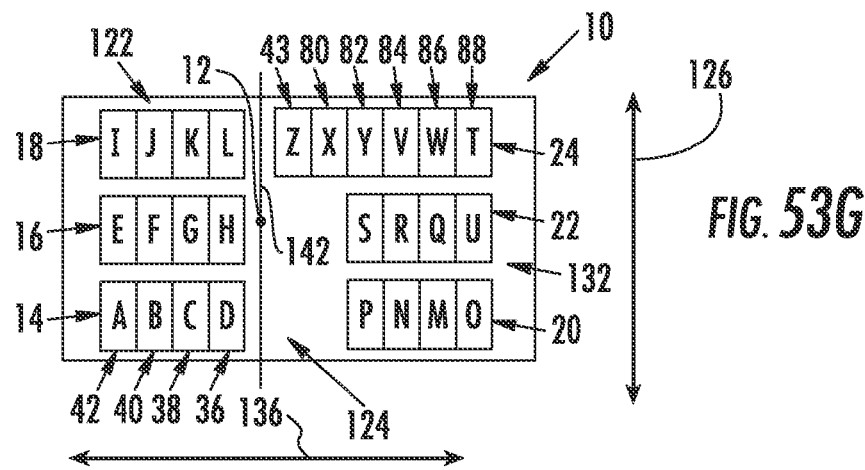

In FIG. 53G the groupings include keys arranged in the left/right direction 136 and groupings 14, 16 and 18 are on the left side 122, and groupings 20, 22 and 24 are on the right side 124. The letters D, H, L, P, S and Z of the various groupings are closest to the boundary line 142 in the left/right direction 136. The keys associated with letters A, E, I, O, U and T are farthest from the boundary line 142 of their respective groupings in the left/right direction 136. Grouping 18 is highest and grouping 14 is lowest in the up/down direction 126 on the left side 122, and grouping 24 is highest and grouping 20 lowest in the up/down direction 126 on the right side 124. Row 38 that includes the letters C, G and K is the second closest row to the boundary line 142 on the left side 122, and row 40 that includes the letters B, F and 3 is the third closest row to the boundary line 142 on the left side 122 in the left/right direction 136. On the right side 124, row 80 that includes the letter X is the second closest row and row 82 that includes the letters Y, S and P is the third closest row to the boundary line 142 in the left/right direction 136. Row 84 that includes letters V, R and N is the fourth closest row, and row 86 that includes letters W, Q and M is the fifth closest row to the boundary line 142 in the left/right direction 136 on the right side 124.

Figure 53H:
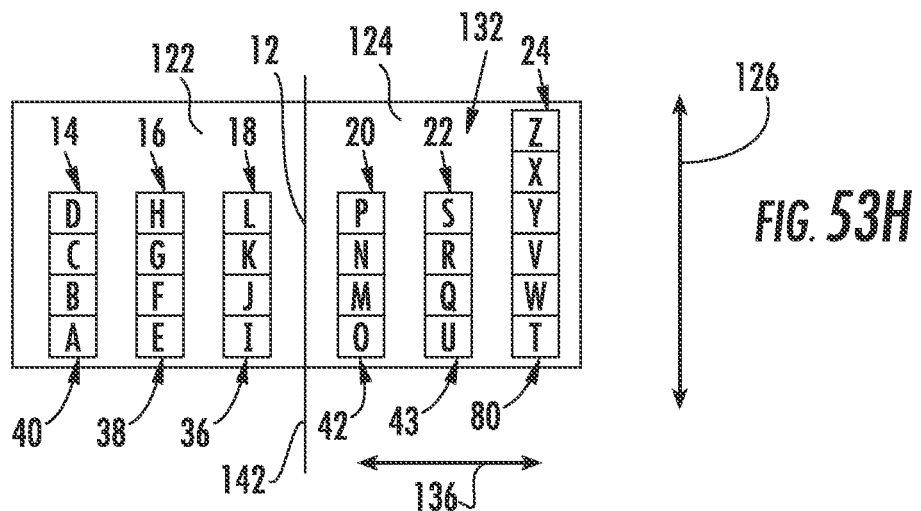

In FIG. 53H the groupings include keys arranged in the up/down direction 126 and groupings 14, 16 and 18 are on the left side 122, and groupings 20, 22 and 24 are on the right side 124. The letters L, K, J and I of the third grouping 18 in row 36 are closest to the boundary line 142 in the left/right direction 136 on the left side 122. The letters P, N, M and O of the fourth grouping 20 in row 42 are closest to the boundary line 142 on the right side 124 in the left/right direction 136. The keys associated with letters A, B, C, and D in the first grouping 14 in row 40 are farthest from the boundary line 142 on the left side 122, and the keys associated with the letters T, W, V, Y, X and Z of the sixth grouping 24 in row 80 are farthest from the boundary line 142 in the left/right direction 136 on the right side 124. The letter Z is highest in the up/down direction 126 on the right side 124, and letters D, H, and L are highest on the left side 122 in the up/down direction 126. The lowest letters in the up/down direction 126 are the letters I, E and A on the left side 122, and the letters T, U and O on the right side 124.

Figure 53I:
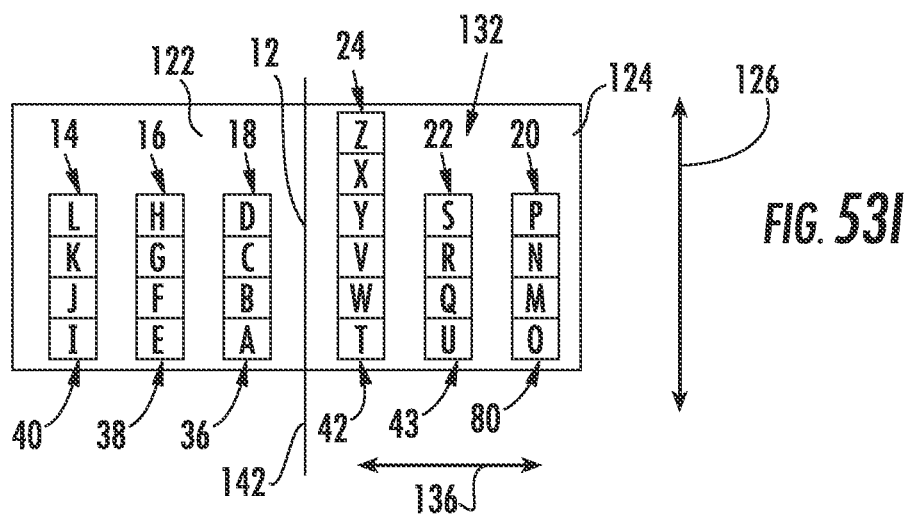

In FIG. 53I the groupings include keys arranged in the up/down direction 126 and groupings 14, 16 and 18 are on the left side 122, and groupings 20, 22 and 24 are on the right side 124. The letters L, K, 3 and I of the third grouping 18 in row 40 are farthest from the boundary line 142 in the left/right direction 136 on the left side 122. The letters P, N, M and O of the fourth grouping 20 in row 80 are farthest from the boundary line 142 on the right side 124 in the left/right direction 136. The keys associated with letters A, B, C, and D in the first grouping 14 in row 36 are closest to the boundary line 142 on the left side 122, and the keys associated with the letters T, W, V, Y, X and Z of the sixth grouping 24 in row 42 are closest to the boundary line 142 in the left/right direction 136 on the right side 124. The letter Z is highest in the up/down direction 126 on the right side 124, and letters D, H, and L are highest on the left side 122 in the up/down direction 126. The lowest letters in the up/down direction 126 are the letters I, E and A on the left side 122, and the letters T, U and O on the right side 124.

The various exemplary embodiments in FIGS. 53A-53I and those not explicitly disclosed in the figures can have alphabetic progression that flows from left to right in the left/right direction 136, from right to left in the left/right direction 136, from up to down in the up/down direction 126 or from down to up in the up/down direction 126. From the left side 122 to the right side 124, the alphabetic progression of the arrays can proceed from top to bottom in the up/down direction 126 on both sides 122 and 124, from top to bottom on the left side 122 but then bottom to top on the right side 124, from bottom to top on both the left and right sides 122 and 124 in the up/down direction 126, or from bottom to top on the left side 122 but from top to bottom on the right side 124 in the up/down direction. The T and U letters may be out of place on their individual groupings but the rest of the letters of the alphabet may be in place in their correct groupings and thus the above mentioned arrangements are made in relation to the other correct alphabetic progression of letters without regard to the letters T and U.

All of the letters of the various embodiments of FIGS. 53A-53I are assigned to a single key. It is to be understood that the embodiments of FIGS. 53A-53I, in addition to all of the other embodiments of text entry device 10, may have keys that have multiple letters assigned thereto. As described, colors may be used to distinguish the groupings from one another. The first grouping 14 can include the letters A-D, the second grouping 16 letters E-H, the third grouping 18 letters I-L, the fourth grouping 20 letters O-P, and the fifth grouping 22 letters U, Q, R and S. The sixth grouping 24 can include the letters T, V, W, X, Y and Z. In one embodiment, the first grouping 14 may be blue, the second grouping 16 green, the third grouping 18 yellow, the fourth grouping 20 orange, the fifth grouping 22 red, and the sixth grouping 24 violet. In another embodiment the first grouping 14 may be blue, the second grouping 16 green, the third grouping 18 yellow, the fourth grouping 20 violet, the fifth grouping 22 red, and the sixth grouping 24 orange. In another embodiment the first grouping 14 may be red, the second grouping 16 green, the third grouping 18 yellow, the fourth grouping 20 orange, the fifth grouping 22 blue, and the sixth grouping 24 violet. In yet another exemplary embodiment, the first grouping 14 may be red, the second grouping 16 green, the third grouping 18 yellow, the fourth grouping 20 violet, the fifth grouping 22 blue, and the sixth grouping 24 orange.

The colors may also be used to distinguish numbers on the device 10 from symbols such as the *, #, (, ), %, and @ keys. Actuation of the convert key 76 will then cause actuation of any of the keys having letters to instead of causing letters to be output cause the symbols or numbers to be output. The numbers and the * and # symbols can be located on groupings that are associated with the primary colors of red, yellow and blue. The other symbols such as the +, −, @, %, ~, and ! keys can be located on keys in the groupings associated with the secondary colors of green, orange, and violet.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed:

1. A text entry device, comprising:
   a concentric, wherein at least one key is located at the concentric and wherein all of the letters of the alphabet are spaced from the concentric;
   a first grouping of letters including the letters A, B, C and D, wherein the first grouping has at least one key that is touched by a user when actuated; and
   a second grouping of letters including the letters E, F, G and H, wherein the second grouping has at least one key that is touched by the user when actuated, wherein at least a portion of the key of the first grouping is located at a different angular position with respect to the concentric than at least a portion of the key of the second grouping.

2. The text entry device as set forth in claim 1, wherein:
   the first grouping has four keys and each one of the four keys is associated with one of the letters A, B, C and D, wherein the key of the first grouping associated with the letter A is closest to the concentric, and wherein the keys of the first grouping extend in the radial direction from the concentric;
   wherein the second grouping has four keys and each one of the four keys is associated with one of the letters E, F, G and H, wherein the key of the second grouping associated with the letter E is closest to the concentric, and wherein the keys of the second grouping extend in the radial direction from the concentric; and
   further comprising:
   a third grouping of letters including the letters I, J, K and L, wherein the third grouping has four keys and each one of the four keys is associated with one of the letters I, J, K and L, wherein the key of the third grouping associated with the letter I is closest to the concentric, and wherein the keys of the third grouping extend in the radial direction from the concentric;
   a fourth grouping of letters including the letters O, M, N and P, wherein the fourth grouping has four keys and each one of the four keys is associated with one of the letters O, M, N and P, wherein the key of the fourth grouping associated with the letter O is closest to the concentric, and wherein the keys of the fourth grouping extend in the radial direction from the concentric;
   a fifth grouping of letters including the letters U, Q, R and S, wherein the fifth grouping has four keys and each one of the four keys is associated with one of the letters U, Q, R and S, wherein the key of the fifth grouping associated with the letter U is closest to the concentric, and wherein the keys of the fifth grouping extend in the radial direction from the concentric; and
   a sixth grouping of letters including the letters T, V, W, X, Y and Z, wherein the sixth grouping has five keys and wherein each one of four of the five keys are associated with one of the letters T, V, W and X, and wherein the fifth one of the five keys is associated with both of the letters Y and Z, wherein the key of the sixth grouping associated with the letter T is closest to the concentric.

3. The text entry device as set forth in claim 2, wherein a space key is located at the concentric, and wherein the keys of the first, second, third, fourth, fifth and sixth groupings are arranged in a spiral configuration about the concentric.

4. The text entry device as set forth in claim 2, wherein:
   the keys of the first grouping are associated with the color blue;

the keys of the second grouping are associated with the color green;

the keys of the third grouping are associated with the color yellow;

the keys of the fourth grouping are associated with the color orange;

the keys of the fifth grouping are associated with the color red; and the keys of the sixth grouping are associated with the color purple.

5. A text entry device, comprising:

a concentric;

a first grouping of letters including the letters A, B, C and D, wherein the first grouping has at least one key that is touched by a user when actuated; and a second grouping of letters including the letters E, F, G and H, wherein the second grouping has at least one key that is touched by the user when actuated, wherein at least a portion of the key of the first grouping is located at a different angular position with respect to the concentric than at least a portion of the key of the second grouping;

wherein:

the first grouping has a first key associated with the letters A and B, and a second key associated with the letters C and D, wherein the first key of the first grouping is located closer to the concentric in the radial direction than the second key of the first grouping;

the second grouping has a first key associated with the letters E and F, and a second key associated with the letters G and H, wherein the first key of the second grouping is located closer to the concentric in the radial direction than the second key of the second grouping;

and further comprisings:

a third grouping of letters including the letters I, J, K and L, wherein the third grouping has a first key associated with the letters I and J, and a second key associated with the letters K and L, wherein the first key of the third grouping is located closer to the concentric in the radial direction than the second key of the third grouping;

a fourth grouping of letters including the letters O, M, N and P, wherein the fourth grouping has a first key associated with the letters O and M, and a second key associated with the letters N and P, wherein the first key of the fourth grouping is closer to the concentric in the radial direction than the second key of the fourth grouping;

a fifth grouping of letters including the letters U, Q, R and S, wherein the fifth grouping has a first key associated with the letters U and Q, and a second key associated with the letters R and S, wherein the first key of the fifth grouping is closer to the concentric in the radial direction than the second key of the fifth grouping; and a sixth grouping of letters including the letters T, V, W, X, Y and Z, wherein the sixth grouping has a first key associated with the letters T and V and a second key associated with the letters Y and Z, wherein the first key of the sixth grouping is closer to the concentric in the radial direction than the second key of the sixth grouping.

6. The text entry device as set forth in claim 5, wherein the sixth grouping has a third key associated with the letters W and X, wherein the first key of the sixth grouping is closer to the concentric in the radial direction than the third key of the sixth grouping, and wherein the second key and third key of the sixth grouping are located at the same distance from the concentric in the radial direction.

7. The text entry device as set forth in claim 5, wherein the first key of the sixth grouping is associated with the letter W, and wherein the second key of the sixth grouping is associated with the letter X.

8. The text entry device as set forth in claim 5, wherein:

the keys of the first grouping are associated with the color blue;

the keys of the second grouping are associated with the color green;

the keys of the third grouping are associated with the color yellow;

the keys of the fourth grouping are associated with the color orange;

the keys of the fifth grouping are associated with the color red; and the keys of the sixth grouping are associated with the color purple.

9. The text entry device as set forth in claim 1, Wherein the first grouping has a plurality of keys that are touched by the user when actuated, wherein the plurality of keys are arranged so as to extend from the concentric in a linear direction in the radial direction and then at a 90° angle.

10. The text entry device as set forth in claim 1, wherein:

the first grouping is associated with the color blue;

the second grouping is associated with the color green;

and further comprising:

a third grouping of letters including the letters I, J, K and L, wherein the third grouping has at least one key that is touched by the user when actuated, wherein at least a portion of the key of the third grouping is located at a different angular position with respect to the concentric than at least a portion of the key of the second grouping, wherein the third grouping is associated with the color yellow;

a fourth grouping of letters including the letters O, M, N and P, wherein the fourth grouping has at least one key that is touched by the user when actuated, wherein at least a portion of the key of the fourth grouping is located at a different angular position with respect to the concentric than at least a portion of the key of the third grouping, wherein the fourth grouping is associated with the color violet;

a fifth grouping of letters including the letters U, Q, R and S, wherein the fifth grouping has at least one key that is touched by the user when actuated, wherein at least a portion of the key of the fifth grouping is located at a different angular position with respect to the concentric than at least a portion of the key of the fourth grouping, wherein the fifth grouping is associated with the color red; and a sixth grouping of letters including the letters T, V, W, X, Y and Z, wherein the sixth grouping has at least one key that is touched by the user when actuated, wherein at least a portion of the key of the sixth grouping is located at a different angular position with respect to the concentric than at least a portion of the key of the fifth grouping, wherein the sixth grouping is associated with the color orange.

11. The text entry device as set forth in claim 1, wherein:

the first grouping is associated with the color red;

the second grouping is associated with the color green;

and further comprising:

a third grouping of letters including the letters I, J, K and L, wherein the third grouping has at least one key that is touched by the user when actuated, wherein at least a portion of the key of the third grouping is located at a different angular position with respect to the concentric than at least a portion of the key of the second grouping, wherein the third grouping is associated with the color yellow;

a fourth grouping of letters including the letters O, M, N and P, wherein the fourth grouping has at least one key that is touched by the user when actuated, wherein at least a portion of the key of the fourth grouping is located at a different angular position with respect to the concentric than at least a portion of the key of the third grouping, wherein the fourth grouping is associated with the color orange;

a fifth grouping of letters including the letters U, Q, R and S, wherein the fifth grouping has at least one key that is touched by the user when actuated, wherein at least a portion of the key of the fifth grouping is located at a different angular position with respect to the concentric than at least a portion of the key of the fourth grouping, wherein the fifth grouping is associated with the color blue; and a sixth grouping of letters including the letters T, V, W, X, Y and Z, wherein the sixth grouping has at least one key that is touched by the user when actuated, wherein at least a portion of the key of the sixth grouping is located at a different angular position with respect to the concentric than at least a portion of the key of the fifth grouping, wherein the sixth grouping is associated with the color violet.

12. The test text entry device as set forth in claim 1, wherein:

the first grouping is associated with the color red;
the second grouping is associated with the color green;
and further comprising:

a third grouping of letters including the letters I, J, K and L, wherein the third grouping has at least one key that is touched by the user when actuated, wherein at least a portion of the key of the third grouping is located at a different angular position with respect to the concentric than at least a portion of the key of the second grouping, wherein the third grouping is associated with the color yellow;

a fourth grouping of letters including the letters O, M, N and P, wherein the fourth grouping has at least one key that is touched by the user when actuated, wherein at least a portion of the key of the fourth grouping is located at a different angular position with respect to the concentric than at least a portion of the key of the third grouping, wherein the fourth grouping is associated with the color violet;

a fifth grouping of letters including the letters U, Q, R and S, wherein the fifth grouping has at least one key that is touched by the user when actuated, wherein at least a portion of the key of the fifth grouping is located at a different angular position with respect to the concentric than at least a portion of the key of the fourth grouping, wherein the fifth grouping is associated with the color blue; and a sixth grouping of letters including the letters T, V, W, X, Y and Z, wherein the sixth grouping has at least one key that is touched by the user when actuated, wherein at least a portion of the key of the sixth grouping is located at a different angular position with respect to the concentric than at least a portion of the key of the fifth grouping, wherein the sixth grouping is associated with the color orange.

13. A text entry device, comprising:

a first secondary concentric;

a first grouping of letters including the letters A, B, C and D, wherein the first grouping has at least one key that is located immediately adjacent the first secondary concentric, wherein the at least one key of the first grouping is actuated by a left thumb of a user, and wherein all of key(s) of the first grouping is/are actuated by only the left thumb of the user;

a second secondary concentric;

a grouping of letters including the letters T, V, W, X, Y and Z, wherein the grouping of letters has at least one key that is located immediately adjacent the second secondary concentric, wherein the at least one key of the grouping is actuated by a right thumb of the user.

14. The text entry device as set forth in claim 13, further comprising:

a second grouping of letters including the letters E, F, G and H, wherein the second grouping has at least one key that is located immediately adjacent the first secondary concentric, wherein the at least one key of the second grouping of letters is actuated by the left thumb of the user, wherein at least a portion of the key of the first grouping is located at a different angular position with respect to the first secondary concentric than at least a portion of the key of the second grouping;

a third grouping of letters including the letters I, J, K and L, wherein the third grouping has at least one key that is located immediately adjacent the first secondary concentric, wherein the at least one key of the third grouping of letters is actuated by the left thumb of the user, wherein at least a portion of the key of the third grouping is located at a different angular position with respect to the first secondary concentric than at least a portion of the key of the second grouping;

a fourth grouping of letters including the letters O, M, N and P, wherein the fourth grouping has at least one key that is located immediately adjacent the second secondary concentric, wherein the at least one key of the fourth grouping of letters is actuated by the right thumb of the user;

a fifth grouping of letters including the letters U, Q, R and S, wherein the fifth grouping has at least one key that is located immediately adjacent the second secondary concentric, wherein the at least one key of the fifth grouping of letters is actuated by the right thumb of the user, wherein at least a portion of the key of the fifth grouping is located at a different angular position with respect to the second secondary concentric than at least a portion of the key of the fourth grouping; and wherein the grouping that includes the letters T, V, W, X, Y and Z is a sixth grouping, wherein at least a portion of the key of the sixth grouping is located at a different angular position with respect to the second secondary concentric than at least a portion of the key of the fifth grouping.

15. The text entry device as set forth in claim 13, further comprising:

a second grouping of letters including the letters E, F, G and H, wherein the second grouping has at least one key that is located immediately adjacent the second secondary concentric, wherein the at least one key of the second grouping of letters is actuated by the right thumb of the user;

a third grouping of letters including the letters I, J, K and L, wherein the third grouping has at least one key that is located immediately adjacent the first secondary concentric, wherein the at least one key of the third grouping of letters is actuated by the left thumb of the user, wherein at least a portion of the key of the third grouping is located at a different angular position with respect to the first secondary concentric than at least a portion of the key of the first grouping;

a fourth grouping of letters including the letters O, M, N and P, wherein the fourth grouping has at least one key that is located immediately adjacent the second secondary concentric, wherein the at least one key of the fourth grouping of letters is actuated by the right thumb of the user, wherein at least a portion of the key of the fourth grouping is located at a different angular position with respect to the second secondary concentric than at least a portion of the key of the second grouping;

a fifth grouping of letters including the letters U, Q, R and S, wherein the fifth grouping has at least one key that is located immediately adjacent the first secondary concentric, wherein the at least one key of the fifth grouping of letters is actuated by the left thumb of the user, wherein at least a portion of the key of the fifth grouping is located at a different angular position with respect to the first secondary concentric than at least a portion of the key of the third grouping; and wherein the grouping that includes the letters T, V, W, X, Y and Z is a sixth grouping, wherein at least a portion of the key of the sixth grouping is located at a different angular position with respect to the second secondary concentric than at least a portion of the key of the fourth grouping.

16. The text entry device as set forth in claim 14, wherein:

the first grouping has two keys that extend linearly from the first secondary concentric in a radial direction of the first secondary concentric, and wherein the key associated with the letters A and B is closer to the first secondary concentric than the key associated with the letters C and D;

the second grouping has two keys that extend linearly from the first secondary concentric in the radial direction of the first secondary concentric, and wherein the key associated with the letters E and F is closer to the first secondary concentric than the key associated with the letters G and H, wherein all portions of the keys of the second grouping are located at a different angular position with respect to the first secondary concentric than all portions of the keys of the first grouping;

the third grouping has two keys that extend linearly from the first secondary concentric in the radial direction of the first secondary concentric, and wherein the key associated with the letters I and J is closer to the first secondary concentric than the key associated with the letters K and L, wherein all portions of the keys of the third grouping are located at a different angular position with respect to the first secondary concentric than all portions of the keys of the second grouping;

the fourth grouping has two keys that extend linearly from the second secondary concentric in the radial direction of the second secondary concentric, and wherein the key associated with the letters O and M is closer to the second secondary concentric than the key associated with the letters N and P;

the fifth grouping has two keys that extend linearly from the second secondary concentric in the radial direction of the second secondary concentric, and wherein the key associated with the letters U and Q is closer to the second secondary concentric than the key associated with the letters R and S, wherein all portions of the keys of the fifth grouping are located at a different angular position with respect to the second secondary concentric than all portions of the keys of the fourth grouping;

the sixth grouping has three keys and the key associated with the letters T and V is closest to the second secondary concentric than the other keys of the sixth grouping, wherein the key associated with the letters W and X is located at the same radial distance from the second secondary concentric as the key associated with the letters Y and Z, wherein all portions of the keys of the sixth grouping are located at a different angular position with respect to the second secondary concentric than all portions of the keys of the fifth grouping.

17. A text entry device, comprising:

a concentric about which all of the letters of the alphabet are disposed;

a first grouping of letters including the letters A, B, C and D, wherein the first grouping has at least one key and wherein all of the keys of the first grouping are located on a left side of the concentric;

a second grouping of letters including the letters E, F, G and H, wherein the second grouping has at least one key and wherein all of the keys of the second grouping are located on the left side of the concentric;

a third grouping of letters including the letters I, J, K and L, wherein the third grouping has at least one key and wherein all of the keys of the third grouping are located on the left side of the concentric;

a fourth grouping of letters including the letters O, M, N and P, wherein the fourth grouping has at least one key and wherein all of the keys of the fourth grouping are located on a right side of the concentric that is on a side of the concentric opposite to the left side of the concentric;

a fifth grouping of letters including the letters U, Q, R and S, wherein the fifth grouping has at least one key and wherein all of the keys of the fifth grouping are located on the right side of the concentric; and a sixth grouping of letters including the letters T, V, W, X, Y and Z, wherein the sixth grouping has at least one key and wherein all of the keys of the sixth grouping are located on the right side of the concentric.

18. The text entry device as set forth in claim 17, wherein:

the first grouping has a plurality of keys and wherein the key associated with the letter A is the closest key of the first grouping to the concentric;

the second grouping has a plurality of keys and wherein the key associated with the letter E is the closest key of the second grouping to the concentric;

the third grouping has a plurality of keys and wherein the key associated with the letter I is the closest key of the third grouping to the concentric;

the fourth grouping has a plurality of keys and wherein the key associated with the letter O is the closest key of the fourth grouping to the concentric;

the fifth grouping has a plurality of keys and wherein the key associated with the letter U is the closest key of the fifth grouping to the concentric; and the sixth grouping has a plurality of keys and wherein the key associated with the letter T is the closest key of the sixth grouping to the concentric.

19. The text entry device as set forth in claim 17, wherein:

the first grouping has a plurality of keys and wherein the key associated with the letter A is the farthest key of the first grouping from the concentric;

the second grouping has a plurality of keys and wherein the key associated with the letter E is the farthest key of the second grouping from the concentric;

the third grouping has a plurality of keys and wherein the key associated with the letter I is the farthest key of the third grouping from the concentric;

the fourth grouping has a plurality of keys and wherein the key associated with the letter O is the farthest key of the fourth grouping from the concentric;

the fifth grouping has a plurality of keys and wherein the key associated with the letter U is the farthest key of the fifth grouping from the concentric; and the sixth grouping has a plurality of keys and wherein the key associated with the letter T is the farthest key of the sixth grouping from the concentric.

20. The text entry device as set forth in claim 17, wherein:

the first grouping has a plurality of keys that are arranged in an up/down configuration;

the second grouping has a plurality of keys that are arranged in an up/down configuration, wherein the keys of the second grouping are located closer to the concentric than the keys of the first grouping;

the third grouping has a plurality of keys that are arranged in an up/down configuration, wherein the keys of the third grouping are located closer to the concentric than the keys of the first grouping and second grouping;

the fourth grouping has a plurality of keys that are arranged in an up/down configuration;

the fifth grouping has a plurality of keys that are arranged in an up/down configuration, wherein the keys of the fourth grouping are located closer to the concentric than the keys of the fifth grouping;

the sixth grouping has a plurality of keys that are arranged in an up/down configuration, wherein the keys of the fourth grouping are located closer to the concentric than the keys of the sixth grouping and wherein the keys of the fifth grouping are located closer to the concentric than the keys of the sixth grouping.

21. The text entry device as set forth in claim 1, wherein all of the keys of the concentric, the first grouping, and the second grouping are soft keys.

22. The text entry device as set forth in claim 5, wherein all of the keys of the first grouping, the second grouping, the third grouping, the fourth grouping, the fifth grouping, and the sixth grouping are soft keys.

* * * * *